United States Patent
Iino et al.

(10) Patent No.: US 6,396,194 B1
(45) Date of Patent: *May 28, 2002

(54) ULTRASOUND MOTOR AND ELECTRONIC APPARATUS EQUIPPED WITH ULTRASONIC MOTOR

(75) Inventors: Akihiro Iino; Masao Kasuga; Makoto Suzuki; Kenji Suzuki, all of Chiba (JP)

(73) Assignee: Seiko Instruments Inc. (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/177,455

(22) Filed: Oct. 22, 1998

(30) Foreign Application Priority Data

Oct. 23, 1997 (JP) .................................. 9-291343

(51) Int. Cl.⁷ .................................. H01L 41/04
(52) U.S. Cl. .................................. 310/323.16
(58) Field of Search ............. 310/323.02, 323.12, 310/323.16, 328

(56) References Cited

U.S. PATENT DOCUMENTS

| 5,345,137 | A | * | 9/1994 | Funakubo et al. | .......... | 310/323 |
| 5,453,653 | A | * | 9/1995 | Zumeris | .......... | 310/323 |
| 5,616,980 | A | * | 4/1997 | Zumeris | .......... | 310/323 |
| 5,682,076 | A | * | 10/1997 | Zumeris | .......... | 310/323 |
| 5,877,579 | A | * | 3/1999 | Zumeris | .......... | 310/317 |

FOREIGN PATENT DOCUMENTS

| DE | 3833342 | * | 5/1990 |
| JP | 2-007875 | * | 6/1988 |
| JP | 2-041673 | * | 7/1988 |

* cited by examiner

Primary Examiner—Nestor Ramirez
Assistant Examiner—Peter Medley
(74) Attorney, Agent, or Firm—Adams & Wilks

(57) ABSTRACT

An ultrasonic motor has a vibrating body polarized in a given direction. The vibrating body comprises a first piezoelectric body and a second piezoelectric body laminated to the first piezoelectric body in a preselected direction generally parallel to the polarized direction. Each of the first piezoelectric body and the second piezoelectric body has a first polarized portion and a second polarized portion. The first polarized portion of the first piezoelectric body is aligned in the preselected direction with the second polarized portion of the second piezoelectric body. The second polarized portion of the first piezoelectric body is aligned in the preselected direction with the first polarized portion of the second piezoelectric body. A movable member is frictionally driven by a combination of a stretching vibration and a bending vibration generated by applying a driving signal to the first polarized portions of the first and second piezoelectric bodies or to the second polarized portions of the first and second piezoelectric bodies.

20 Claims, 15 Drawing Sheets

GND

C

ULTRASOUND MOTOR AND ELECTRONIC APPARATUS EQUIPPED WITH ULTRASONIC MOTOR

BACKGROUND OF THE INVENTION

The present invention relates to an ultrasonic motor in which piezoelectric vibrators are laminated in a body in the longitudinal direction in parallel to its polarizing direction land more particularly to an improvement of an ultrasonic motor utilizing longitudinal vibration of the piezoelectric vibrators and an electronic apparatus equipped with the ultrasonic motor.

An ultrasonic motor utilizing vibration of piezoelectric vibrators is drawing attention lately in the field of micromotors.

An ultrasonic motor utilizing stretching vibration and bending vibration of rectangular piezoelectric vibrators (dual-mode vibrator) in particular is used in various uses because it is capable of moving an object linearly or rotatably by combined vibration of those two vibrations. An ultrasonic motor of a type in which piezoelectric bodies are layered is also used a high output is required (see Japanese Patent Laid-Open No. Hei. 7-184382).

FIG. 16 shows an ultrasonic motor of a type in which rectangular plate-like piezoelectric bodies are layered. A basic vibrator of the ultrasonic motor comprises piezoelectric bodies 61, 62, 63, 64, 65 and 66 which are polarized in a predetermined manner so as to vibrate in the dual mode and are layered in the polarizing direction, output fetching members 71, 72, 73, 74, 75 and 76 provided on edge portions 61a, 62a, 63a, 64a, 65a and 66a provided in the direction vertical to the polarizing direction of the piezoelectric bodies 61 through 66, and electrodes (not shown) provided on both sides of the piezoelectric bodies 61 through 66. The six piezoelectric vibrators, i.e., the piezoelectric bodies of two rows arrayed in the horizontal direction and stacked in three layers in the vertical direction, are held by coupling means 67, 68 and 69.

When voltage is applied from the electrodes, the respective piezoelectric bodies 61 through 66 vibrate in the dual modes and the combined vibration thereof is transmitted to the respective output fetching members 71 through 76 to move an object abutting with the output fetching members 71 through 76.

It is designed to obtain a high output by taking out the output from the plurality of piezoelectric bodies 61 through 66.

However, because the respective piezoelectric bodies 61 through 66 are fixed merely by part thereof by the coupling means 67 through 69, the vibrating direction may vary among the respective piezoelectric bodies 61 through 66 in the ultrasonic motor described above. It also has had a technological problem that because the vibration of the fixed parts of the piezoelectric bodies 61 through 66 is suppressed, it causes vibration loss and the output cannot be taken out effectively.

Still more, it is not preferable to use the above-mentioned coupling means 67 through 69 as the separate members for fixing the respective piezoelectric bodies 61 through 66 because it enlarges and complicates the whole structure of the motor and because the production process thereof is complicated by adding the step for mounting the coupling means 67 through 69.

Meanwhile, although the above-mentioned problem may be solved by laminating the piezoelectric bodies in a body in the polarizing direction and by taking out the output only by the piezoelectric transverse effect, there is a technological problem that a high output cannot be obtained because the electric-mechanic coupling coefficient of the piezoelectric transverse effect is small.

SUMMARY OF THE INVENTION

Accordingly, it is an object of the present invention to solve the above-mentioned technological problems by providing an ultrasonic motor whose vibration loss is suppressed, whose structure is miniaturized, whose production process is simplified and which is capable of utilizing electrical energy efficiently.

It is another object of the present invention to provide an electronic apparatus equipped with an ultrasonic motor.

In order to achieve the above-mentioned objectives, an inventive ultrasonic motor comprises a first piezoelectric body having a first polarized portion excited when voltage is applied and a second piezoelectric body that is laminated with the first piezoelectric body in the longitudinal direction parallel to the polarizing direction. The second piezoelectric body has a first polarized portion at a position separated from the first polarized portion of the first piezoelectric body in the transverse direction vertical to the polarizing direction, and moves a moving body by stretching vibration and bending vibration caused by vibrations of the first polarized portion of the first piezoelectric body and the first polarized portion of the second piezoelectric body in the longitudinal direction.

The polarized portion of the first piezoelectric body and the polarized portion of the second piezoelectric body excite in the vertical and horizontal directions, respectively. The stretching vibration is then produced when the respective vibrations in the longitudinal direction overlap and the bending vibration is produced from the implication between the transverse vibrations and the stretching vibration therearound. The moving body is then moved by elliptic vibration obtained by combining the stretching vibration and the bending vibration.

Further, the piezoelectric vibrators are laminated in a body without using fixing means, so that the vibration is not suppressed and the vibrating direction is fixed.

Accordingly, the invention allows electrical energy to be utilized very efficiently by utilizing the longitudinal vibration caused by the piezoelectric longitudinal effect whose electrical-mechanical coupling coefficient is large, vibration loss to be suppressed, the vibrating direction to be prevented from varying, the structure of the device to be miniaturized and the production process to be simplified.

The invention is further characterized in that the first and second piezoelectric bodies have second polarized portions further at positions corresponding to the first polarized portions.

Thereby, elliptic vibration for rotating in the reverse direction may be taken out by exciting only the second polarized portions of the respective piezoelectric bodies to produce bending vibration having a different phase, for example. Alternatively, the bending vibration may be amplified by exciting the second polarized portion with a different phase from the first polarized portion in the same time. Accordingly, driving force in the both normal and reverse directions may be obtained and the output may be controlled by displacing the bending vibration or by changing the phase.

The invention is further characterized in that a third piezoelectric body which vibrates in the same phase with the stretching vibration is laminated in a body of the ultrasonic motor.

Thereby, the third piezoelectric body vibrates in the longitudinal direction in the same phase with the stretching vibration and amplifies the stretching vibration. Accordingly, the high-output ultrasonic motor may be realized.

The invention is further characterized in that a third polarized portion that vibrates in the same phase with the stretching vibration is provided between the first polarized portion of the first piezoelectric body and the first polarized portion of the second piezoelectric body at least in either one of the first piezoelectric body and the second piezoelectric body. Thereby, the third polarized portion vibrates in the longitudinal direction in the same phase with the stretching vibration and amplifies the stretching vibration. Accordingly, the high-output ultrasonic motor may be realized.

Here, the third polarized portion may be provided only in the first piezoelectric body, only in the second piezoelectric body or in the first and second piezoelectric bodies.

The invention described is further characterized in that the moving body of the ultrasonic motor is abutted to the laminated piezoelectric vibrator in the horizontal direction.

Thereby, the laminated piezoelectric vibrator moves the moving body by the vibration combined in the horizontal direction.

The invention is further characterized in that the laminated piezoelectric vibrator is abutted at least at one point of a spherical moving body of the ultrasonic motor described in any one of the foregoing embodiments.

Thereby, the spherical moving body may be moved about an arbitrary axis by applying a driving force to one point of the spherical moving body by the laminated piezoelectric vibrator or may be moved arbitrary by applying a driving force to a plurality of points.

The invention is further characterized in that an electronic apparatus equipped with the ultrasonic motor comprises the ultrasonic motor described in any one of the foregoing embodiments. Thereby, the electronic apparatus equipped with the ultrasonic motor having the ultrasonic motor as a driving source may be realized.

The specific nature of the invention, as well as other objects, uses and advantages thereof, will clearly appear from the following description and from the accompanying drawings in which like numerals refer to like parts.

BRIEF DESCRIPTION OF THE DRAWINGS

FIGS. 1a and 1b are explanatory drawings showing a first embodiment in which the present invention is applied to an ultrasonic motor, wherein FIG. 1a shows a sectional structure thereof and FIG. 1b shows a planar structure thereof;

FIGS. 2a through 2d are explanatory diagrams, wherein FIGS. 2a and 2c show the planar structure of the piezoelectric vibrator shown in FIG. 1 and FIGS. 2b and 2d show the structure of the piezoelectric body;

FIGS. 3a and 3b are explanatory diagrams, wherein FIG. 3a shows a structure of one side electrode shown in FIG. 1 and FIG. 3b shows a structure of another side electrode shown in FIG. 1;

FIGS. 5a through 5f show a second embodiment in which the present invention is applied to an ultrasonic motor, wherein FIGS. 5a, 5c and 5e show a planar structure of the piezoelectric vibrator and FIGS. 5b, 5d and 5f show a planar structure of the piezoelectric body;

FIGS. 6a and 6b are explanatory diagrams, wherein FIG. 6a shows disposition of one side electrode shown in FIG. 5 and FIG. 6b shows disposition of another side electrode;

FIGS. 7a through 7d are explanatory drawings showing a third embodiment in which the present invention is applied to an ultrasonic motor, wherein FIGS. 7a and 7c shows a planar structure of the piezoelectric vibrator and FIGS. 7b and 7d show a planar structure of the piezoelectric body;

FIGS. 8a and 8b are explanatory diagrams, wherein FIG. 8a shows disposition of one side electrode shown in FIG. 7 and FIG. 8b shows disposition of another side electrode;

FIGS. 9a through 9d are explanatory drawings showing a fourth embodiment in which the present invention is applied to an ultrasonic motor, wherein FIGS. 9a and 9c shows a planar structure of the piezoelectric vibrator and FIGS. 9b and 9d show a planar structure of the piezoelectric body;

FIGS. 10a and 10b are explanatory diagrams, wherein FIG. 10a shows disposition of one side electrode shown in FIG. 9 and FIG. 10b shows disposition of another side electrode;

FIGS. 11a through 11f are explanatory drawings showing a fifth embodiment in which the present invention is applied to an ultrasonic motor, wherein FIGS. 11a, 11c, and 11e shows a planar structure of the piezoelectric vibrator and FIGS. 11b, 11d, and 11f show a planar structure of the piezoelectric body;

FIGS. 12a and 12b are explanatory diagrams, wherein FIG. 12a shows disposition of one side electrode shown in FIG. 11 and FIG. 12b shows disposition of another side electrode;

DETAILED DESCRIPTION OF THE PREFERRED EMBODIMENTS

Preferred embodiments to which the present invention has been applied will be explained below in detail with reference to FIGS. 1 through 15.

[First Embodiment]

Figure 1A:
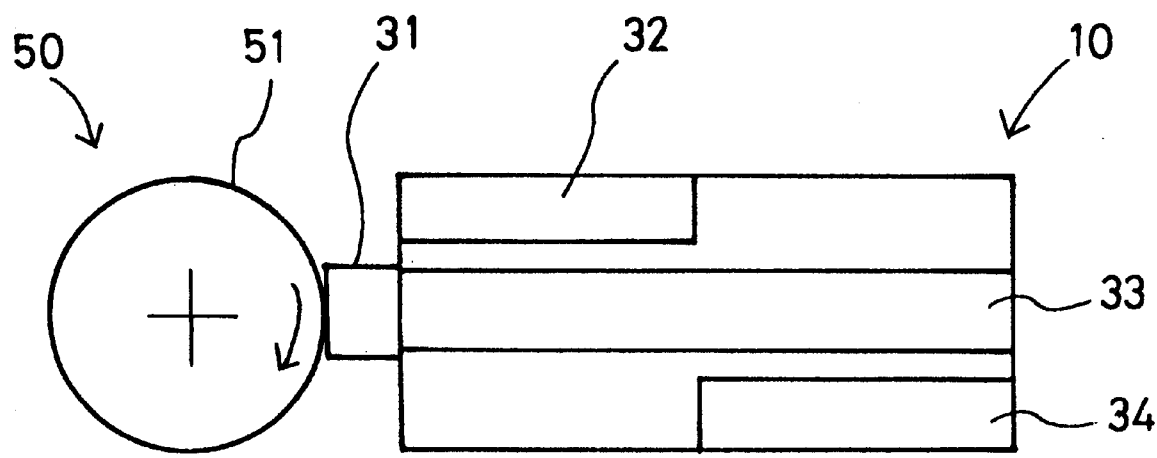
Figure 1B:
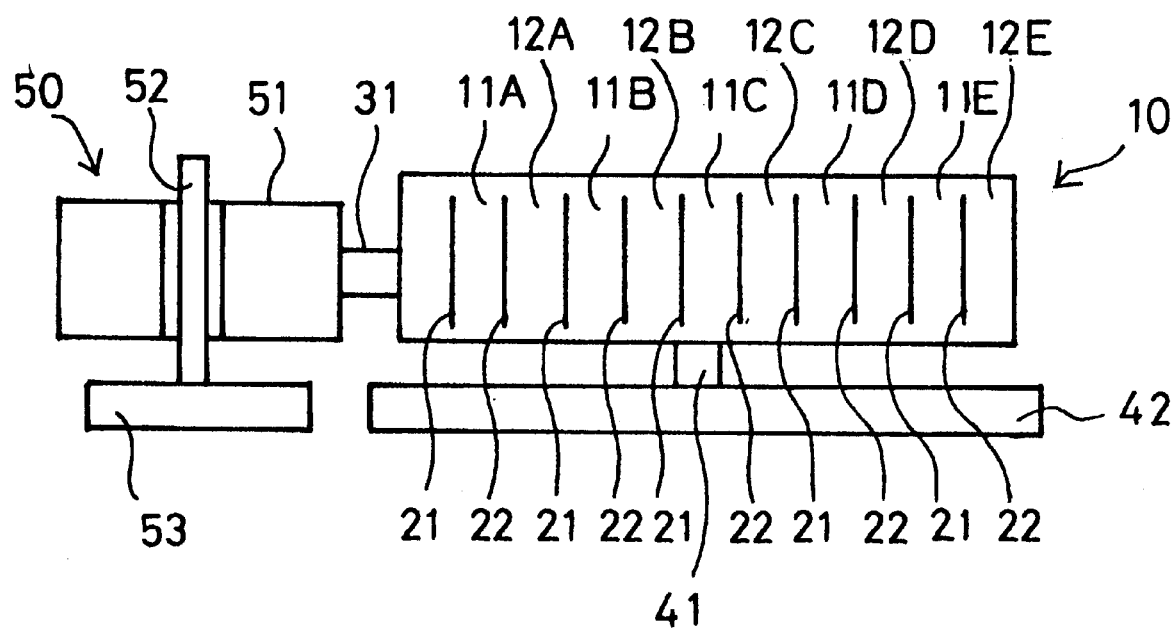

FIGS. 1a and 1b are explanatory drawings showing a first embodiment in which the present invention is applied to an ultrasonic motor, wherein FIG. 1a shows a sectional structure thereof and FIG. 1b shows a planar structure thereof.

As shown in FIGS. 1a and 1b, according to the present embodiment, the ultrasonic motor comprises a vibrating body 10, an output fetching member 31 provided on an end of the vibrating body 10 in the laminating direction, a moving body 50 abutting with the output fetching member 31 and pressurizing mechanisms 41 and 42 for supporting the vibrating body 10 and pressurizing the moving body 50 and the output fetching member 31.

The moving body 50 comprises a rotor 51 having a rotary bearing, a rotary shaft 52 penetrating through the rotor 51 and a fixing member 53 for fixing the basal end of the rotary shaft 52.

The output fetching member 31 is a rectangular parallelepiped member having a rigidity. It is provided to transmit vibration of the vibrating body 10 to the rotor 51 and to amplify displacement of the vibration.

The pressurizing mechanisms 41 and 42 comprise a fixing member 42 provided so as to face to the vibrating body 10 and a pressurizing member 41 for pressurizing the vibrating body 10 toward the moving body 50.

The vibrating body 10 is constructed by alternately laminating piezoelectric bodies 11A, 11B, 11C, 11D and 11E and piezoelectric bodies 12A, 12B, 12C, 12D and 12E in a body such that the piezoelectric body 11A and piezoelectric body 12A are paired and the piezoelectric body 11B and 12B are paired, for example.

Planar electrodes 21 are fixed on one end face of the respective piezoelectric bodies 11A through 11E at a region corresponding to polarization and reference electrodes 22 are fixed on the face of the respective piezoelectric bodies 12A through 12E facing the planar electrodes 21 of the piezoelectric bodies 11A through 11E as counter electrodes.

FIGS. 2a through 2d show the planar structure of the piezoelectric bodies 11A through 11E and the piezoelectric bodies 12A through 12E and patterns of the electrodes 21 and 22.

It is noted that the piezoelectric body 11A as a first piezoelectric body of the invention is identical with the piezoelectric bodies 11B and 11C and the piezoelectric body 11D as a second piezoelectric body of the invention is identical with the piezoelectric body 11E. The piezoelectric body 12A is also identical with the piezoelectric bodies 12B through 12E, so that only the piezoelectric bodies 11A and 11D and the piezoelectric bodies 12A and 12D which are paired with them will be explained below as the representative piezoelectric bodies.

As shown in FIGS. 2a through 2d, the piezoelectric bodies 11A and 11D and the piezoelectric bodies 12A and 12D are rectangular plate-like members for which a ferroelectric material such as barium titanate and lead zirconate titanate is used. The aspect ratio of the vibrating body 10 is set so as to cause a predetermined resonance frequency.

Figure 2A:
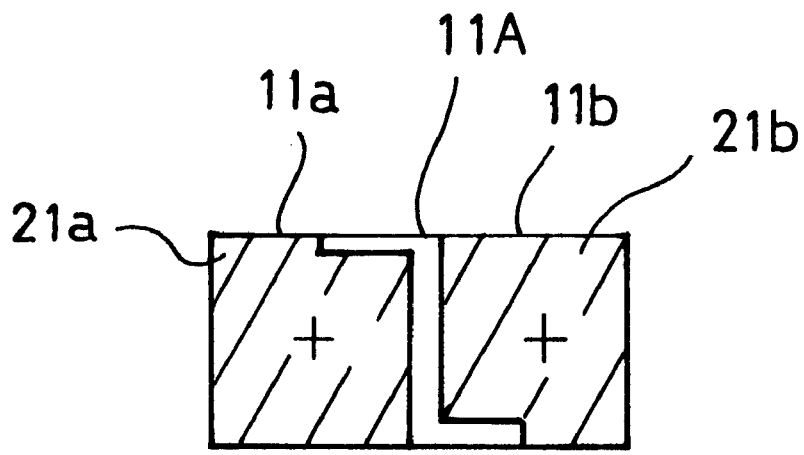
Figure 2B:
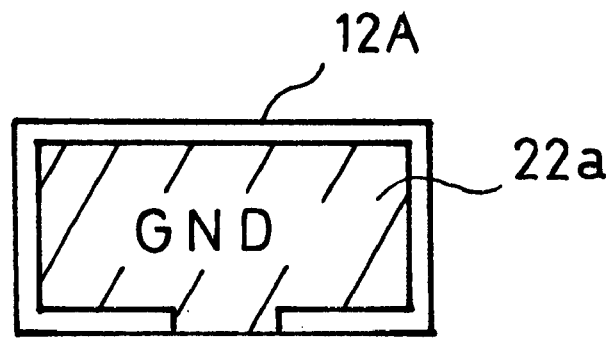
Figure 2C:
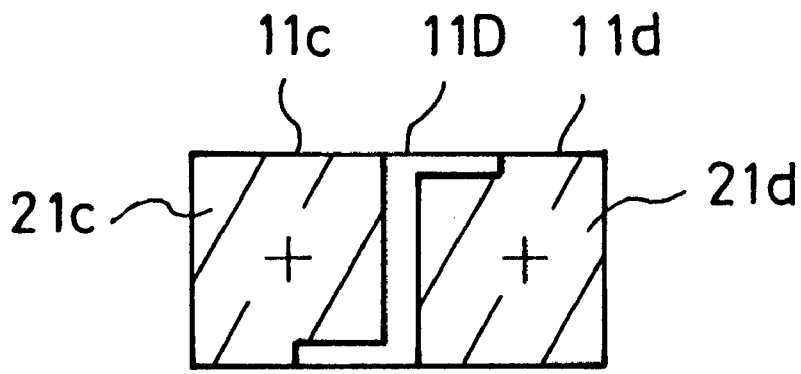
Figure 2D:
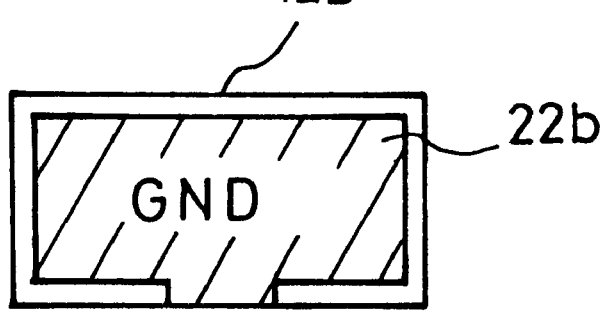

As shown in FIGS. 2a and 2c, long sides of the rectangular plane of the piezoelectric bodies 11A and 11D are bisected so as to divide the plane into two parts 11a and 11b and 11c and 11d and planar electrodes 21a and 21b and 21c and 21d are fixed in correspondence to the respective polarized portions 11a through 11d.

Part of the one planar electrode 21a fixed to the piezoelectric body 11A is connected with a side electrode described later at one long edge of the rectangular plane of the piezoelectric body 11A and part of the other planar electrode 21b is connected with the side electrode at the other long edge of the rectangular plane. Further, part of the planar electrode 21d fixed to the piezoelectric body 11D is connected with the side electrode at one long edge of the rectangular plane and part of the planar electrode 21c is connected thereto at the other long edge of the rectangular plane.

Reference electrodes 22a and 22b are fixed almost on the whole surface of the rectangular plane of the piezoelectric bodies 12A and 12D as the reference for the planar electrodes 21a and 21b and 21c and 21d as shown in FIG. 2b. Part of the reference electrodes 22a and 22b is connected with the side electrode at the other long edge of the rectangular plane.

A polarization process is implemented on the vibrating body 10 laminated in a body by applying a voltage exceeding a resistive electric field based on the electrodes 22 and by setting the electrodes 21 as plus as shown in the figures.

Figure 3A:
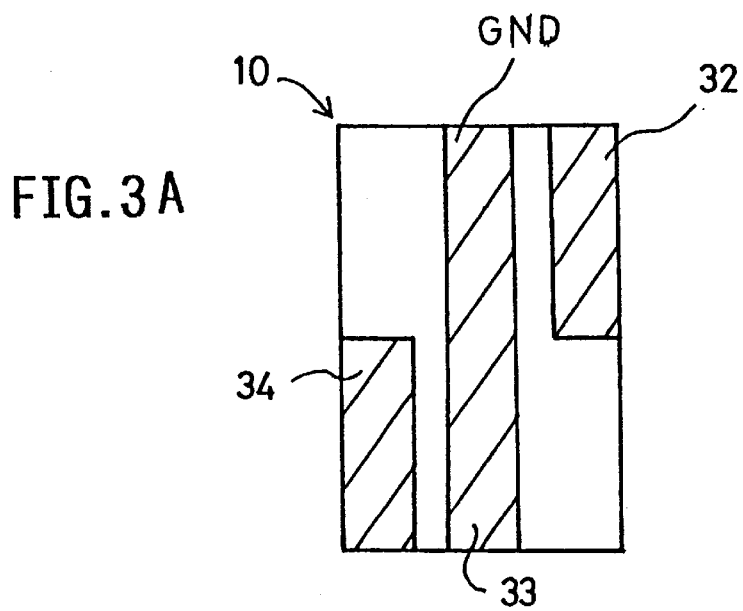
Figure 3B:
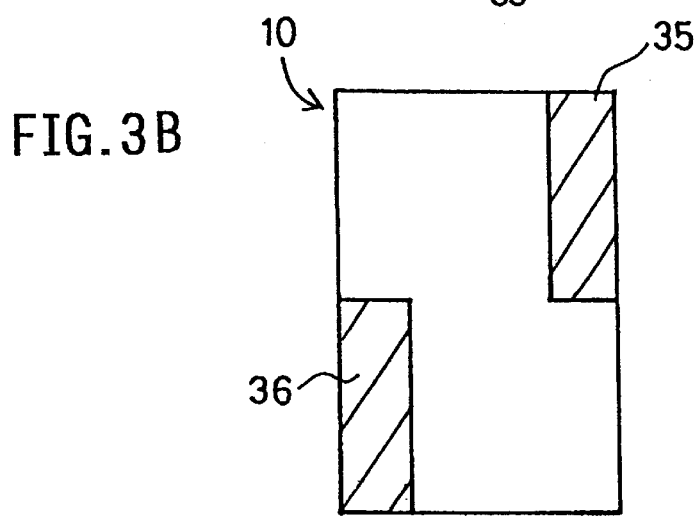

FIGS. 3a and 3b show patterns of the side electrodes 32, 33, 34, 35 and 36 provided along the plane of lamination of the vibrating body 10.

The side electrodes 32 through 34 are provided on one side face corresponding to the long edge of the vibrating body 10 as shown in FIG. 3a and the side electrodes 35 and 36 are provided on the other side face as shown in FIG. 3b.

Here, the side electrode 32 is connected to the planar electrodes 21b of the piezoelectric bodies 11A through 11C, the side electrode 33 is connected to the reference electrodes 22a and 22b of the piezoelectric bodies 12A through 12E and the side electrode 34 is connected to the planar electrodes 21c of the piezoelectric bodies 11D and 11E. Meanwhile, the side electrode 35 is connected to the planar electrodes 21a of the piezoelectric bodies 11A through 11C and the side electrode 36 is connected to the planar electrodes 21d of the piezoelectric bodies 11D and 11E.

Next, a first use of the ultrasonic motor will be explained based on FIGS. 2 through 4.

When voltage is applied to the respective side electrodes 32, 33 and 34 shown in FIG. 3a to normally rotate the rotor 51 at first, voltage having the same phase is applied to the planar electrodes 21b of the piezoelectric bodies 11A through 11C, the reference electrodes 22a and 22b of the piezoelectric bodies 12A through 12E and the planar electrodes 21c of the piezoelectric bodies 11D and 11E as shown in FIG. 2.

The polarized portions 11b of the piezoelectric bodies 11A through 11C and the polarized portions 11c of the piezoelectric bodies 11D and 11E as first polarized portions to which the voltage is applied stretch respectively in the direction parallel to the direction in which the voltage is applied (hereinafter referred to as a piezoelectric longitudinal effect).

Figure 4:
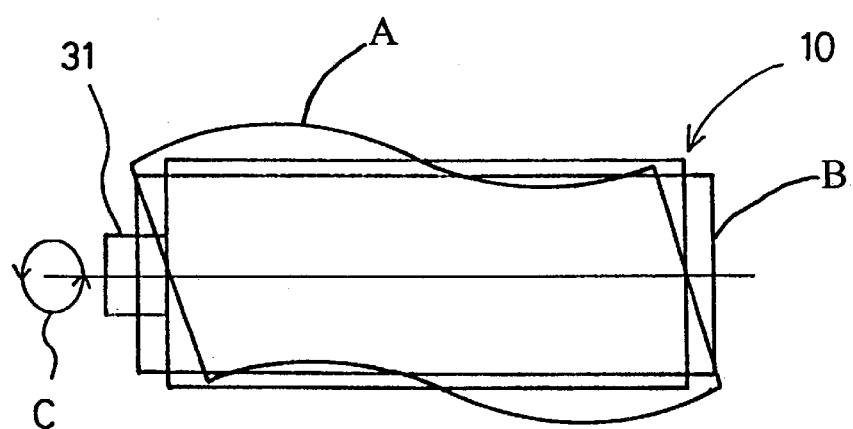
FIG. 4 is an explanatory diagram showing a vibrating state of the vibrator shown in FIG. 1.

FIG. 4 shows a vibrating state of the vibrating body 10.

When the polarized portions 11b of the piezoelectric bodies 11A through 11C and the polarized portions 11c of the piezoelectric bodies 11D and 11E stretch in the longitudinal direction due to the piezoelectric longitudinal effect, the vibrating body 10 causes bending vibration A as well as stretching vibration B as a whole as shown in the figure.

Here, an electric-mechanical coupling coefficient of the piezoelectric longitudinal effect is greater than that of the piezoelectric transverse effect, and an overall energy efficiency is enhanced by utilizing the piezoelectric longitudinal effect.

Further, the vibration of each vibrator is not suppressed and the vibrating direction is also fixed by laminating the piezoelectric vibrators 11A through 11E in a body without using any fixing means.

Then, the output fetching member 31 transmits and amplifies elliptic vibration C obtained by combining the bending vibration A and the stretching vibration B.

The rotor 51 abutting with the output fetching member 31 rotates in the normal direction by periodically receiving frictional force of the fixed direction.

Meanwhile, the rotor 51 may be rotated in the opposite direction as follows. When voltage is applied to the respective side electrodes 33, 35 and 36 shown in FIG. 3, voltage having the same phase is applied to the planar electrodes 21a of the piezoelectric bodies 11A through 11A, the reference electrodes 22a and 22b of the piezoelectric bodies 12A through 12E and the planar electrodes 21d of the piezoelectric bodies 11D and 11E as shown in FIG. 2.

At this time, the polarized portions 11a and the polarized portions 11d as second polarized portions of the present invention are excited and the vibrating body 10 causes the stretching vibration B and bending vibration whose phase differs by 180° from the above-mentioned bending vibration A.

Then, elliptic vibration in the opposite direction from the elliptic vibration C is produced at the edge of the output fetching member 31 and the rotor 51 receives frictional force in the opposite direction, thus rotating in the opposite direction.

A second use of the ultrasonic motor will be explained further.

That is, voltage having the same phase is applied to the side electrodes 32 and 34 shown in FIG. 3 and voltage having the same phase and different from that applied to the side electrodes 32 and 34 is applied to the side electrodes 35 and 36.

At this time, when the polarized portions 21b of the piezoelectric bodies 11A through 11C and the polarized portions 11c of the piezoelectric bodies 11D and 11E contract in the longitudinal direction, for example, it corresponds to stretching of the polarized portions 11a of the piezoelectric bodies 11A through 11C and the polarized portions 11d of the piezoelectric bodies 11D and 11E in the longitudinal direction.

Thereafter, the bending vibration and the stretching vibration are combined and the output fetching member 31 causes modified elliptic vibration.

It is noted that the phase difference of the voltages applied to the side electrodes 32 and 34 and the side electrodes 35 and 36 may be appropriately changed.

Thereby, according to the present embodiment, the polarized portions 21a through 21d of the respective piezoelectric bodies 11A through 11E are excited respectively in the longitudinal direction and the stretching vibration is produced by overlapping the respective vibrations in the longitudinal direction, so that electrical energy may be utilized very efficiently by utilizing the large exciting force.

Further, because the vibration is not suppressed and the vibrating direction is fixed by laminating the piezoelectric bodies 11A through 11E in a body without using any fixing means, vibration loss of the respective piezoelectric bodies 11A through 11E may be suppressed, the vibrating direction may be prevented from varying and the structure of the device may be simplified.

Further, the driving force in the both normal and reverse directions may be obtained just by changing the phase of the voltage for exciting the polarized portions 11b and 11c and the polarized portions 11a and 11d.

[Second Embodiment]

Figure 5A:
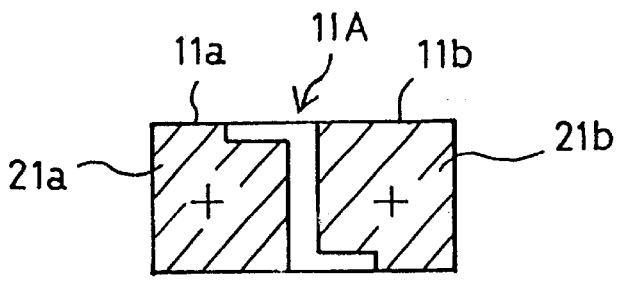
Figure 5B:
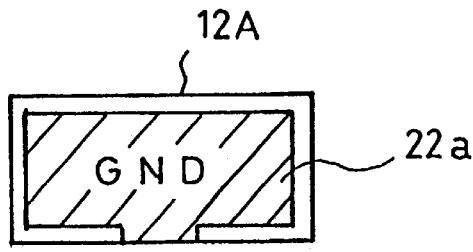
Figure 5C:
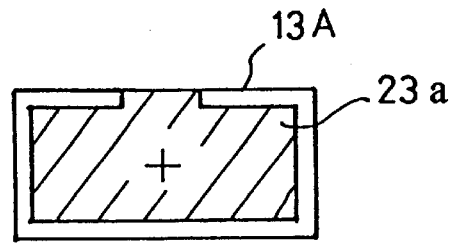
Figure 5D:
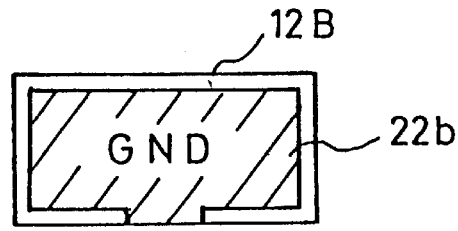
Figure 5E:
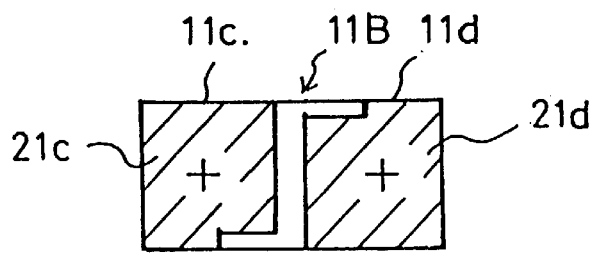
Figure 5F:
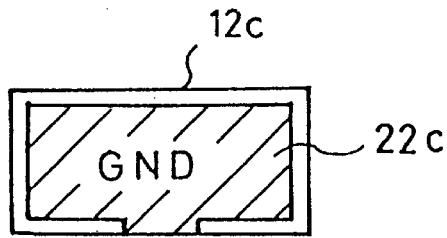
Figure 6:
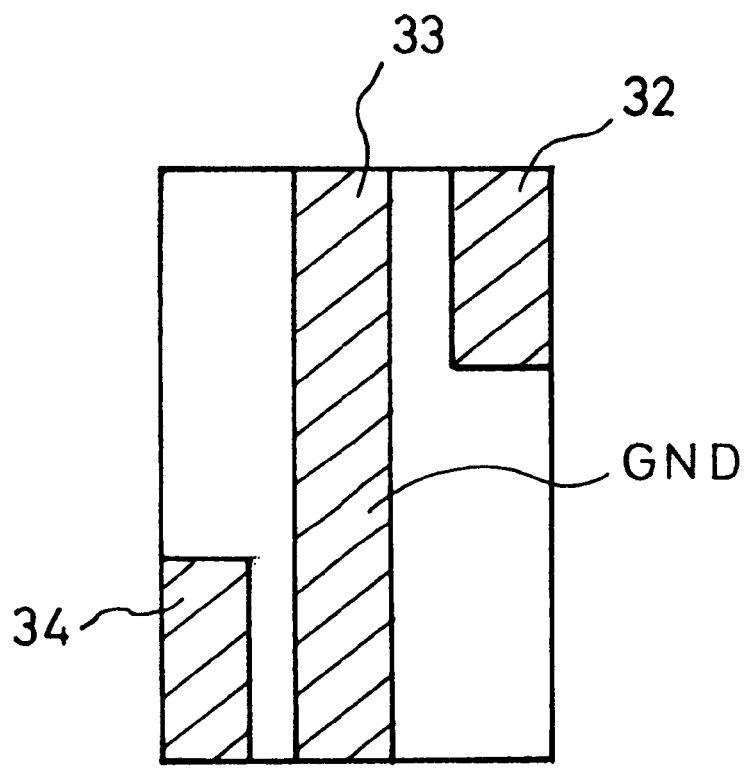
Figure 6:
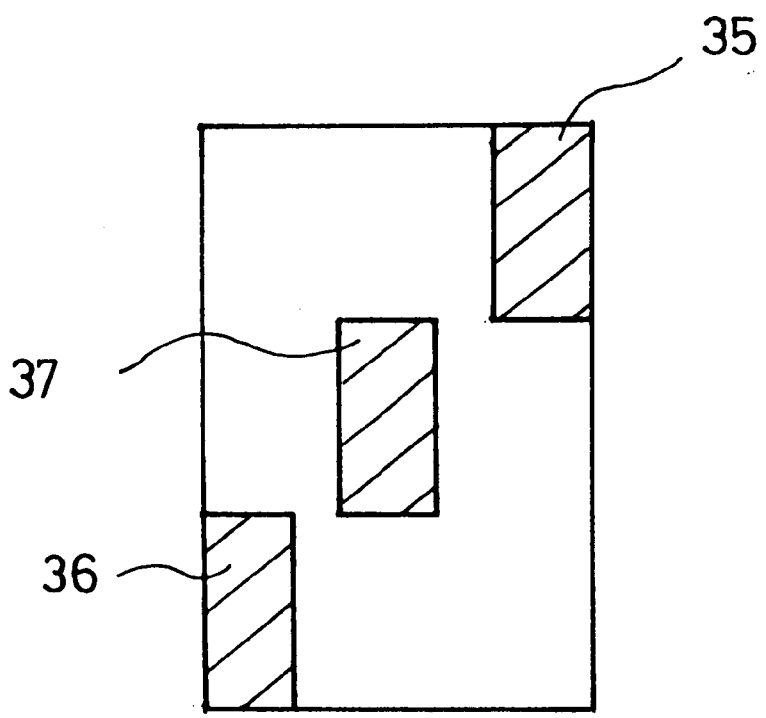

FIGS. 5 and 6 show a second embodiment in which the present invention is applied to an ultrasonic motor, wherein FIGS. 5a through 5f show a basic laminating structure of the vibrating body 10 and FIGS. 6a and 6b show disposition of side electrodes.

As shown in FIGS. 5a, 5b, 5e and 5f, the piezoelectric bodies 11A and 11B and the piezoelectric bodies 12A and 12C which are paired with one another are constructed almost in the same manner as in the first embodiment, so that their explanation will be omitted here.

The present embodiment is characterized in that a piezoelectric body 13A, i.e., a third piezoelectric body, in which a planar electrode 23a is fixed almost on the whole surface of the rectangular plane thereof and a piezoelectric body 12B that is paired with the piezoelectric body 13A are inserted between the pair of piezoelectric bodies 11A and 11B as shown in FIGS. 5c and 5d. A polarization process is implemented on the piezoelectric body 13A in correspondence to the planar electrode 23a and a reference electrode 22b is fixed to the piezoelectric body 12B as a counter electrode.

As shown in FIG. 6a, the side electrode 32 is connected to the planar electrode 21b on the front right side of the piezoelectric body 11A, the side electrode 33 is connected to the reference electrodes 22a, 22b and 22c of the piezoelectric bodies 12A, 12B and 12C and the side electrode 34 is connected to the planar electrode 21c on the front left side of the piezoelectric body 11B.

Further, as shown in FIG. 6b, the side electrode 35 is connected to the planar electrode 11a on the front left side of the piezoelectric body 11A, the side electrode 36 is connected to the planar electrode 21d on the front right side of the piezoelectric body 11B and the side electrode 37 is connected to the planar electrode 23a of the piezoelectric body 13A.

Next, a first use of the present embodiment will be explained based on FIGS. 5 and 6.

When voltage is applied to the side electrodes 32, 33, 34 and 37 shown in FIG. 6 to normally rotate the rotor 51 at first, voltage having the same phase is applied to the planar electrodes 21b on the front right side of the piezoelectric body 11A, the reference electrodes 22a, 22b and 22c of the piezoelectric bodies 12A through 12C, the planar electrode 21c on the front left side of the piezoelectric body 11B and the planar electrode 23a of the piezoelectric body 13A as shown in FIG. 5.

At this time, the vibrating body 10 causes stretching vibration and bending vibration when the polarized portion 11b on the front right side of the piezoelectric body 11A and the polarized portion 11c on the front left side of the piezoelectric body 11B, i.e., the first polarized portions, are excited.

The piezoelectric body 13A also causes stretching vibration in the same phase, thus amplifying the stretching vibration of the vibrating body 10.

Then, the output fetching member 31 causes elliptic vibration and the rotor 51 rotates normally by receiving the frictional force.

The rotor 51 may be rotated in the opposite direction as follows. When voltage is applied to the side electrodes 33, 35, 36 and 37 shown in FIG. 6, voltage having the same phase is applied to the planar electrode 21a on the front left side of the piezoelectric body 11A, the reference electrodes 22a through 22c of the piezoelectric bodies 12A through 12C, the planar electrode 21d on the front right side of the piezoelectric body 11B and the planar electrode 23a of the piezoelectric body 13A, respectively, as shown in FIG. 5.

The polarized portion 11a on the front left side of the piezoelectric body 11A, the polarized portion 21d on the front right side of the piezoelectric body 11B and almost the whole plane of the piezoelectric body 13A, i.e., the second polarized portions, are excited and the vibrating body 10 causes stretching vibration and bending vibration. Then, the output fetching member 31 causes elliptic vibration in the opposite direction and rotates the rotor 51 in the opposite direction.

Meanwhile, in a second use of the ultrasonic motor of the present embodiment, at least two groups among three groups of the side electrodes 32 and 34, the side electrodes 35 and 36 and the side electrode 37 are selected and voltages having different phases are applied to the respective groups.

When the two groups of the side electrodes 32 and 34 and the side electrode 37 are selected for example, the output fetching member 31 causes elliptic vibration having a mode different from the elliptic vibration in the first use.

It is also possible to apply different voltages to the respective groups to vary the elliptic vibration drawn by the output fetching member 31.

As described above, according to the present embodiment, the high-output ultrasonic motor may be realized because the stretching vibration is amplified by the piezoelectric body 13A.

[Third Embodiment]

Figure 7A:
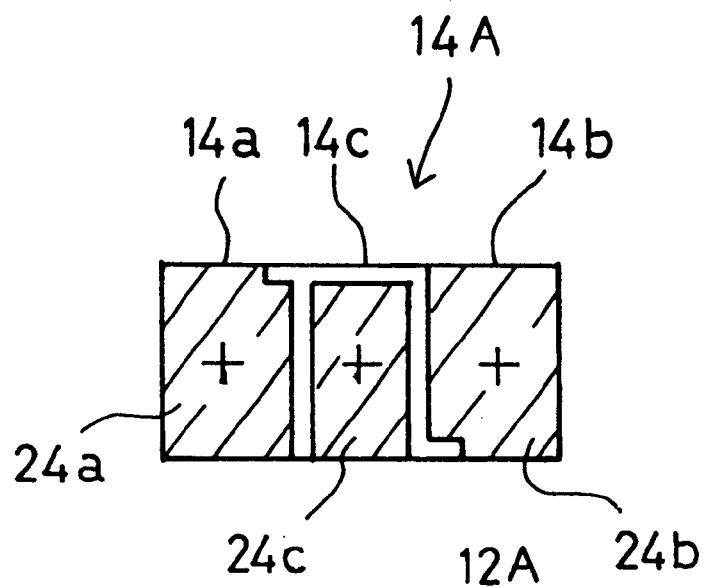
Figure 7B:
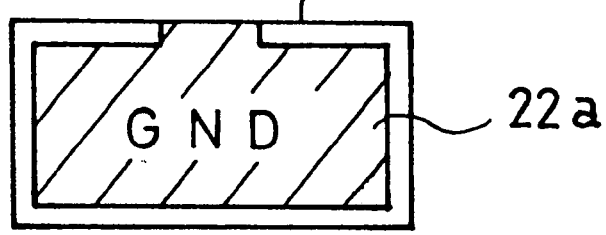
Figure 7C:
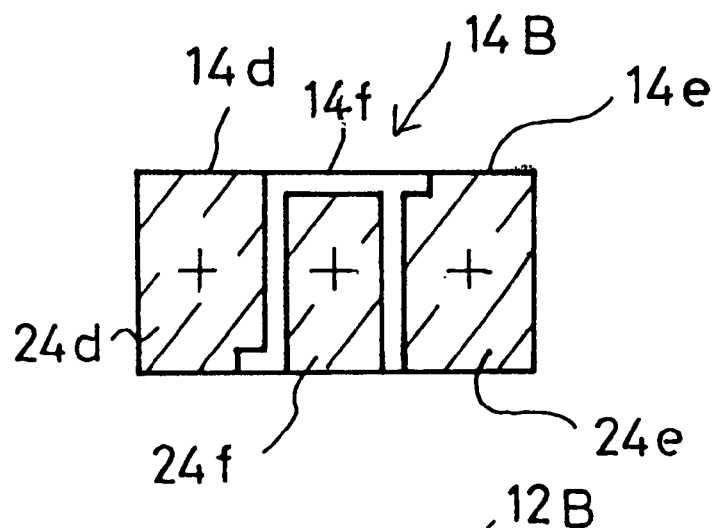
Figure 7D:
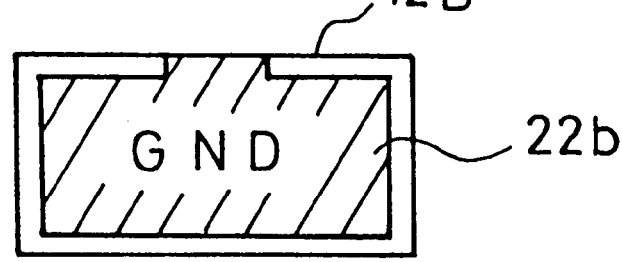
Figure 8A:
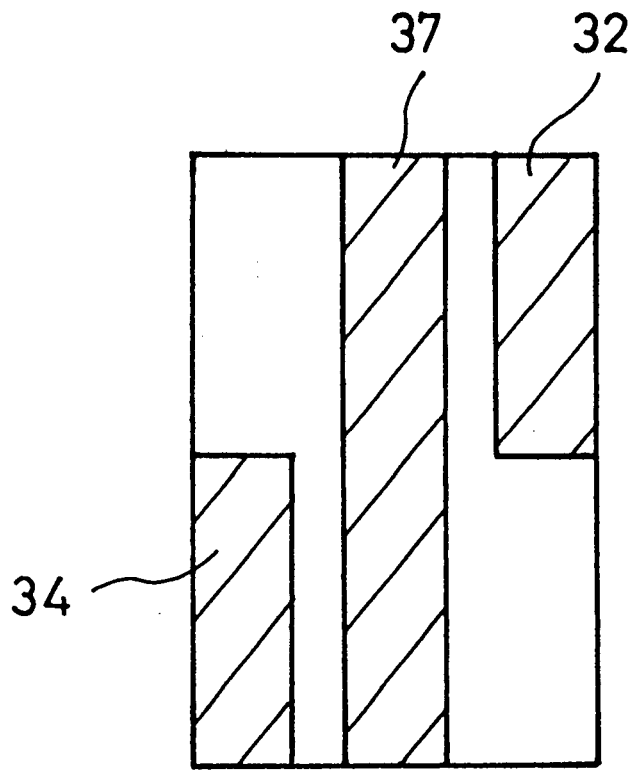
Figure 8B:
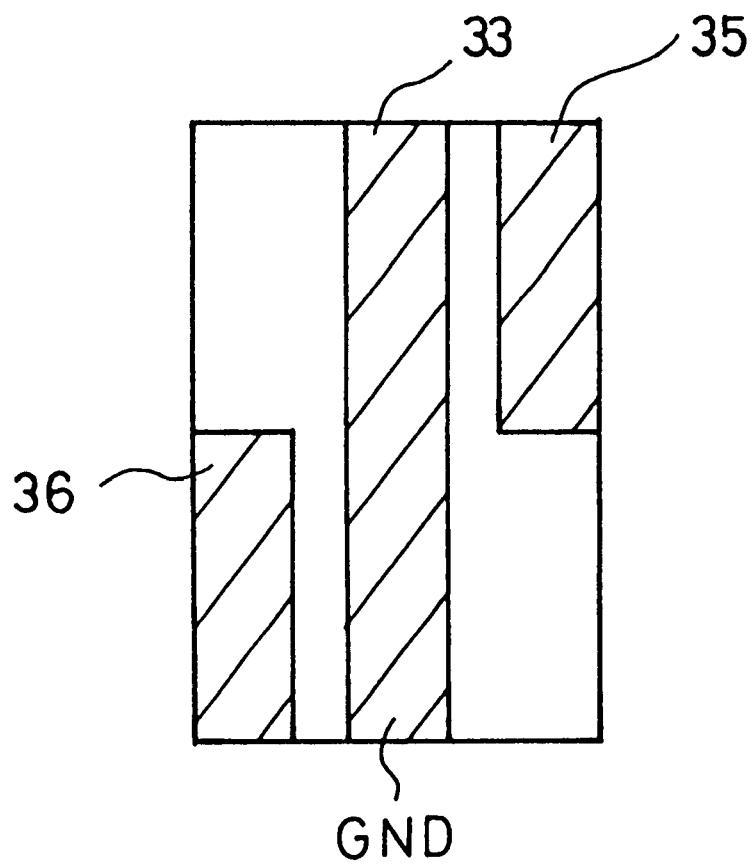

FIGS. 7 and 8 show a third embodiment in which the present invention is applied to an ultrasonic motor, wherein FIGS. 7a through 7d show a basic laminating structure and FIGS. 8a and 8b show disposition of side electrodes.

As shown in FIGS. 7b and 7d, the piezoelectric bodies 12A and 12B which are paired with piezoelectric bodies 14A and 14B are constructed almost in the same manner as in the first embodiment, so that their explanation will be omitted here.

The present embodiment is characterized in that rectangular planes of the piezoelectric bodies 14A and 14B as first and second piezoelectric vibrators are divided into three parts and planar electrodes 24a through 24c and 24d through 24f are fixed corresponding to the respective divided planes 14a through 14c and 14d through 14f as shown in FIGS. 7a and 7c. Then, a polarization process is implemented on the respective divided planes 14a through 14c and 14d through 14f by setting the front page side thereof as plus and the back side thereof as minus and by applying a voltage exceeding a resistive electric field to the planar electrodes 21a through 21d.

Part of one planar electrode 24a fixed to the piezoelectric vibrator 14A is connected at one long edge of the rectangular plane of the piezoelectric body 14A and part of the planar electrodes 24b and 24c is connected at the other long edge of the rectangular plane. Further, part of the planar electrode 24e fixed to the piezoelectric body 14B is connected at one long edge of the rectangular plane and part of the planar electrodes 24d and 24f is connected at the other long edge of the rectangular plane.

The side electrode 32 shown in FIG. 8a is connected to the planar electrode 24b on the front right side of the piezoelectric body 14A, the side electrode 34 is connected to the planar electrode 24d on the front left side of the piezoelectric body 14B and the side electrode 37 is connected to the planar electrodes 24c and 24f at the front center of the planar electrodes 14A and 14B.

Further, the side electrode 35 shown in FIG. 8b is connected to the planar electrode 24a on the front left side of the piezoelectric body 14A, the side electrode 36 is connected to the planar electrode 24e on the front right side of the piezoelectric body 14B and the side electrode 33 is connected to the reference electrodes 22a and 22b of the piezoelectric bodies 12A and 12B.

Next, a first use of the present embodiment will be explained based on FIGS. 7 and 8.

When voltage is applied to the side electrodes 32, 34 and 37 based on the side electrode 33 as shown in FIG. 8 to normally rotate the rotor 51 at first, voltage having the same phase is applied to the planar electrode 24b on the front right side of the piezoelectric body 14A, the planar electrode 24c at the center thereof, the planar electrode 24d on the front left side of the piezoelectric body 14B, the planar electrode 24f at the center thereof and the reference electrodes 22a and 22b of the piezoelectric bodies 12A and 12B as shown in FIG. 7.

At this time, the vibrating body 10 causes stretching vibration and bending vibration when the polarized portion 14b on the front right side of the piezoelectric body 14A and the polarized portion 14d on the front left side of the piezoelectric body 14B as the first polarized portions are excited.

The polarized portion 14c at the center of the piezoelectric body 14A and the polarized portion 14f at the center of the piezoelectric body 14B as third polarized portions causes stretching vibration in the longitudinal direction, thus amplifying the stretching vibration of the vibrating body 10.

Then, the output fetching member 31 causes elliptic vibration and the rotor 51 rotates normally by receiving the frictional force.

The rotor 51 may be rotated in the opposite direction as follows. That is, when a voltage is applied to the side electrodes 35, 36 and 37 based on the side electrode 33 shown in FIG. 8, voltage having the same phase is applied to the planar electrode 24a on the front left side of the piezoelectric body 14A, the planar electrode 24c at the center thereof, the planar electrode 24e on the front right side of the piezoelectric body 14B, the planar electrode 24f at the center thereof and the reference electrodes 22a and 22b of the piezoelectric bodies 12A and 12B as shown in FIG. 7.

The polarized portion 14a on the front left side of the piezoelectric body 14A as the second polarized portion, the polarized portion 14c at the center as the third polarized portion, the polarized portion 24e on the front right side of the piezoelectric body 14B and the polarized portion 24f at the center as the third polarized portion are excited and the vibrating body 10 causes stretching vibration and bending vibration. Then, the output fetching member 31 causes elliptic vibration in the opposite direction and rotates the rotor 51 in the opposite direction.

Meanwhile, as a second use of the ultrasonic motor of the present embodiment, at least two groups among three groups of the side electrodes 32 and 34, the side electrodes 35 and 36 and the side electrode 37 are selected and voltages having different phases are applied to the respective groups.

When the two groups of the side electrodes 32 and 34 and the side electrode 37 are selected for example, the output fetching member 31 causes different elliptic vibration from the elliptic vibration in the first use.

It is also possible to apply different voltages to the respective groups to variegate the elliptic vibration drawn by the output fetching member 31.

As described above, according to the present embodiment, the high-output ultrasonic motor may be obtained because the polarized portion 14c at the center of the piezoelectric body 14A and the polarized portion 14f at the center of the piezoelectric body 14B are provided to amplify the stretching vibration in the longitudinal direction.

[Fourth Embodiment]

Figure 9A:
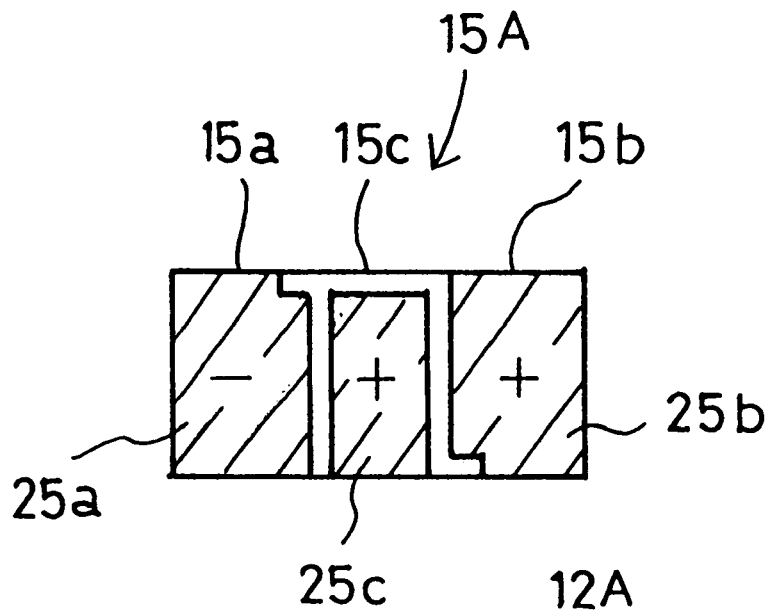
Figure 9B:
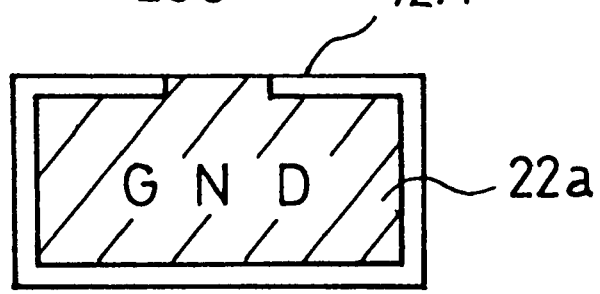
Figure 9C:
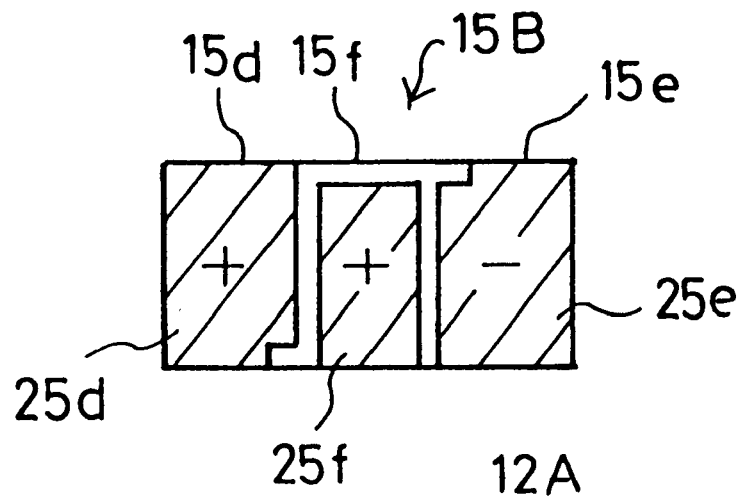
Figure 9D:
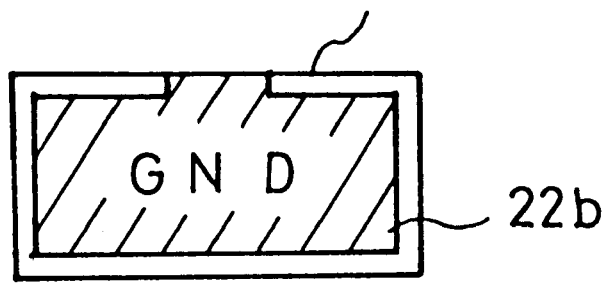
Figure 10A:
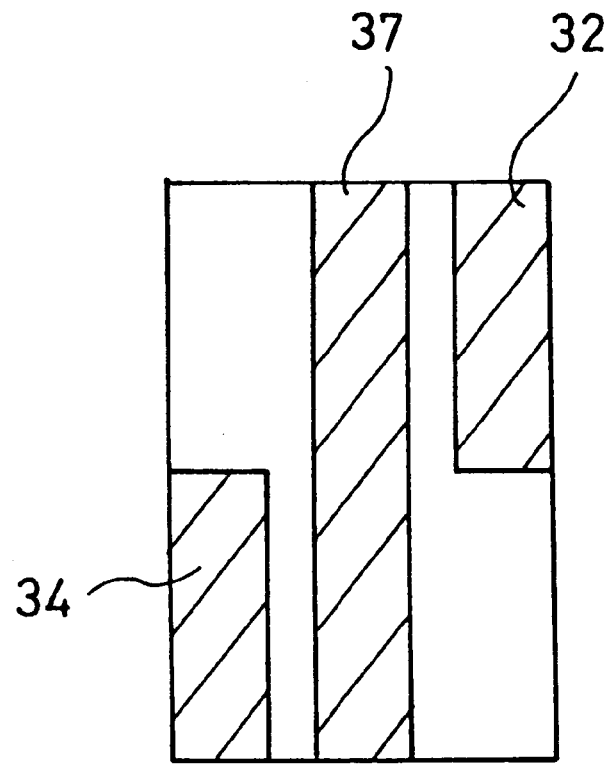
Figure 10B:
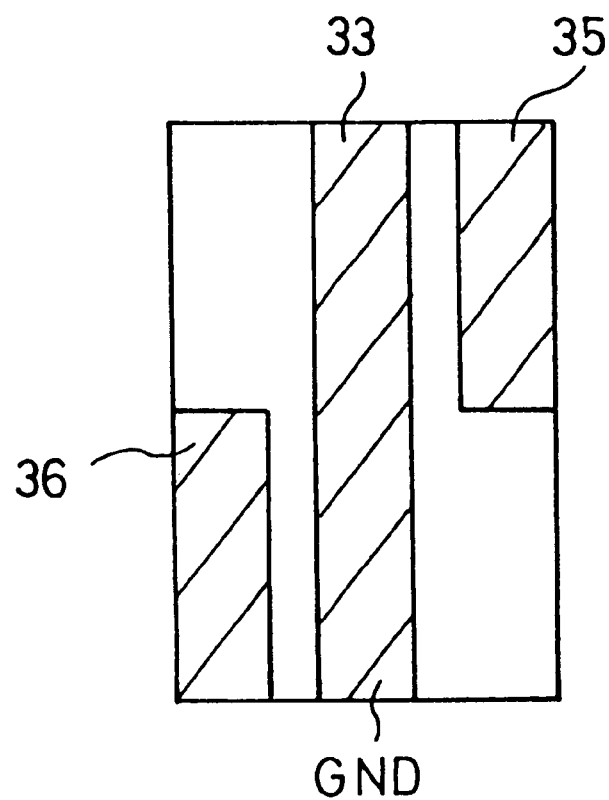

FIGS. 9 and 10 show a fourth embodiment in which the present invention is applied to an ultrasonic motor, wherein FIGS. 9a through 9d show a basic laminating structure and FIGS. 10a and 10b show disposition of side electrodes.

As shown in FIGS. 9b and 9d, the piezoelectric bodies 12A and 12B which are paired with piezoelectric bodies 15A and 15B are constructed almost in the same manner with the first embodiment, so that their explanation will be omitted here.

The present embodiment is characterized in that rectangular planes of the piezoelectric bodies 15A and 15B are divided into three parts and planar electrodes 25a, 25b, 25c, 25d, 25e and 25f are fixed corresponding to the respective divided planes 15a through 15c and 15d through 15f as shown in FIGS. 9a and 9c. Then, a polarization process is implemented on the planar electrodes 25b and 25c of the piezoelectric body 15A and the planar electrodes 25d and 25f of the piezoelectric body 15B by setting the front page side thereof as plus and the back side thereof as minus and on the planar electrode 25a of the piezoelectric body 15A and the planar electrode 25e of the piezoelectric body 15B by setting the front page side thereof as minus and the back side thereof as plus.

Part of one planar electrode 25a fixed to the planar electrode 15A is connected at one long edge of the rectangular plane of the piezoelectric body 15A and part of the planar electrodes 25b and 25c is connected at the other long edge of the rectangular plane. Further, part of the planar electrode 25e fixed to the piezoelectric body 15B is connected at one long edge of the rectangular plane and part of the planar electrodes 25d and 25f is connected at the other long edge of the rectangular plane.

The side electrode 32 shown in FIG. 10a is connected to the planar electrode 25b on the front right side of the planar electrode 15A, the side electrode 34 is connected to the planar electrode 25d on the front left side of the piezoelectric body 15B and the side electrode 37 is connected to the planar electrodes 25c and 25f at the front center of the piezoelectric bodies 15A and 15B.

Further, the side electrode 35 shown in FIG. 10b is connected to the planar electrode 25a on the front left side of the piezoelectric body 15A, the side electrode 36 is connected to the planar electrode 25e on the front right side of the piezoelectric body 15B and the side electrode 33 is connected to the reference electrodes 22a and 22b of the piezoelectric bodies 12A and 12B.

Next, a first use of the present embodiment will be explained based on FIGS. 9 and 10.

When voltage is applied to all of the side electrodes 32, 34, 35, 36 and 37 based on the side electrode 33 shown in FIG. 10 to normally rotate the rotor 51 at first, voltage having the same phase is applied to the planar electrodes 25a through 25c of the piezoelectric body 15A, the planar electrodes 25d through 25f of the piezoelectric body 15B and the reference electrodes 22a and 22b of the piezoelectric bodies 12A and 12B as shown in FIG. 9.

At this time, when the polarized portion 15b on the front right side of the piezoelectric body 15A and the polarized portion 15d on the front left side of the piezoelectric body 15B as the first polarized portions are stretched in the longitudinal direction, the polarized portion 15a on the front left side of the piezoelectric body 15A and the polarized portion 15d on the front right side of the piezoelectric body 15B as second polarized portions contract in the longitudinal direction, thus amplifying the bending vibration of the vibrating body 10.

The polarized portion 15c at the center of the piezoelectric body 15A and the polarized portion 15f at the center of the piezoelectric body 15B as third polarized portions causes stretching vibration in the same phase in the longitudinal direction, thus amplifying the stretching vibration of the vibrating body 10.

Then, the output fetching member 31 causes amplified elliptic vibration and the rotor 51 rotates normally at high speed by receiving the greater frictional force.

As described above, according to the present embodiment, the rotor 51 rotates at higher speed and the high-output ultrasonic motor may be obtained because the polarization process of the piezoelectric bodies 15A and 15B is arranged so as to amplify both of the stretching vibration and bending vibration of the vibrating body 10 and so that the output fetching member 31 causes amplified elliptic vibration.

[Fifth Embodiment]

Figure 11A:
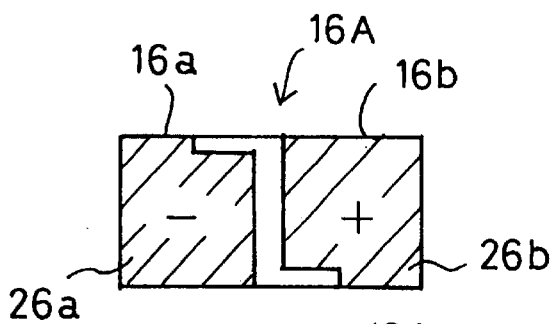
Figure 11B:
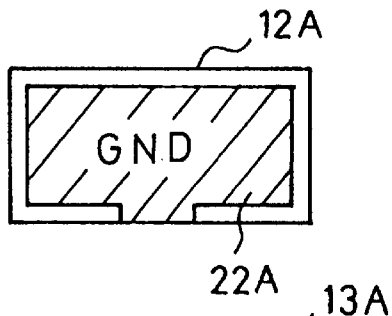
Figure 11C:
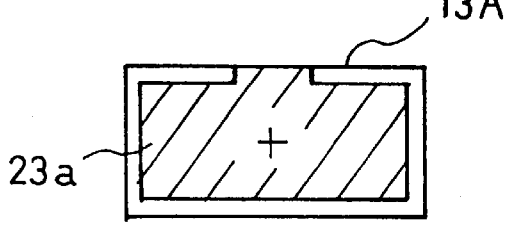
Figure 11D:
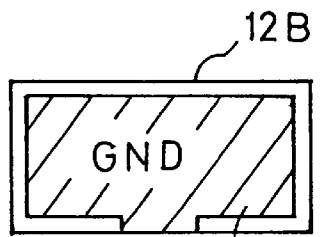
Figure 11E:
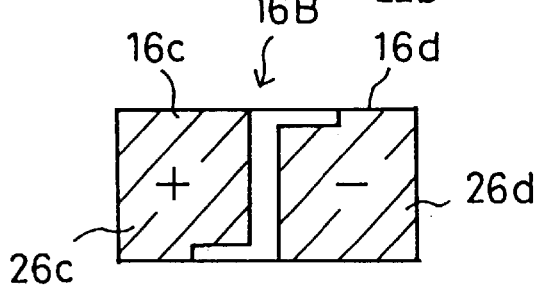
Figure 11F:
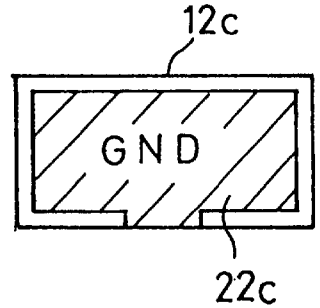
Figure 12A:
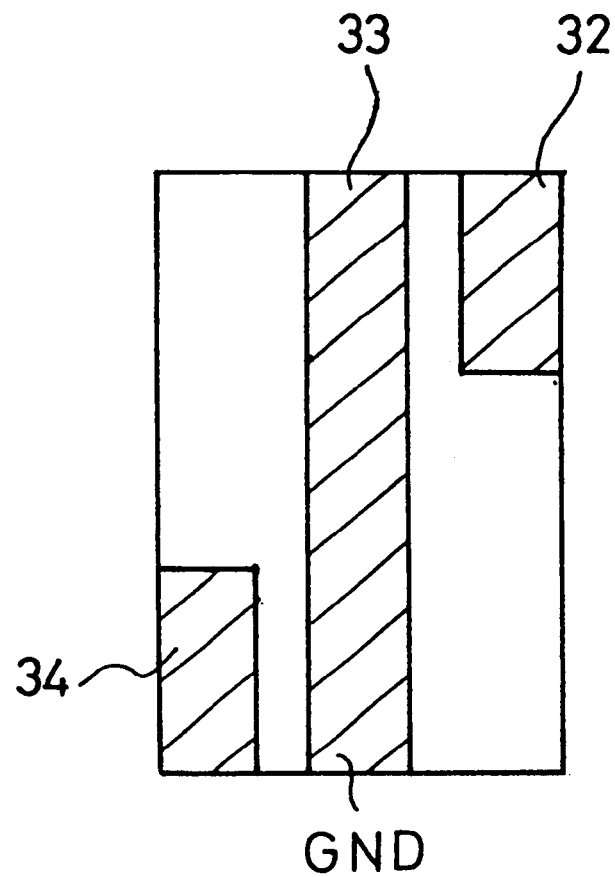
Figure 12B:
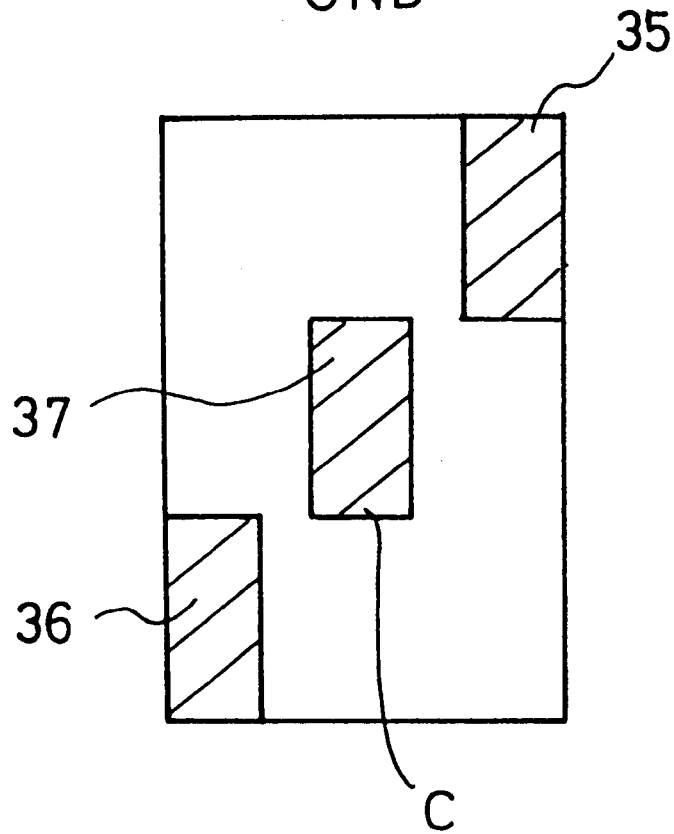

FIGS. 11 and 12 show a fifth embodiment in which the present invention is applied to an ultrasonic motor, wherein FIGS. 11a through 11f show a basic laminating structure and FIGS. 12a and 12b show disposition of side electrodes.

As shown in FIGS. 11b, 11c, 11d and 11f, the present embodiment are constructed almost in the same manner as in the second embodiment, so that the explanation on the piezoelectric body 13A, piezoelectric bodies 12A, 12B and 12C will be omitted here.

The present embodiment is characterized in that a long side of rectangular planes of the piezoelectric bodies 16A and 16B as the first and second piezoelectric bodies are bisected and planar electrodes 26a, 26b, 26c and 26d are fixed corresponding to the respective bisected planes 16a, 16b, 16c and 16d as shown in FIGS. 11a and 11c. Then, a polarization process is implemented on the planar electrode 26b of the piezoelectric body 16A and the planar electrode 26c of the piezoelectric body 16B by setting the front page side thereof as plus and the back side thereof as minus and on the planar electrode 26a of the piezoelectric body 16A and the planar electrode 26d of the piezoelectric body 16B by setting the front page side thereof as minus and the back side thereof as plus.

Part of one planar electrode 26a fixed to the piezoelectric body 16A is connected with the side electrode described later at one long edge of the rectangular plane of the piezoelectric body 16A and part of the other planar electrode 26b is connected with the side electrode at the other long edge of the rectangular plane. Further, part of the planar electrode 26d fixed to the piezoelectric body 16B is connected at one long edge of the rectangular plane and part of the planar electrode 26c is connected at the other long edge of the rectangular plane.

As shown in FIG. 12a, the side electrode 32 is connected to the planar electrode 26b on the front right side of the planar electrode 16A, the side electrode 33 is connected to the reference electrodes 22a, 22b and 22c of the piezoelectric bodies 12A, 12B and 12C, the side electrode 34 is connected to the planar electrode 26c on the front left side of the piezoelectric body 16B.

Further, as shown in FIG. 6b, the side electrode 35 is connected to the planar electrode 26a on the front left side of the piezoelectric body 16A, the side electrode 36 is connected to the planar electrode 26d on the front right side of the piezoelectric body 16B and the side electrode 37 is connected to the planar electrode 23a of the piezoelectric body 13A.

Next, the use of the present embodiment will be explained based on FIGS. 11 and 12.

When voltage is applied to all of the side electrodes 32, 33, 34, 35, 36 and 37 as shown in FIG. 12 to normally rotate the rotor 51 at first, voltage having the same phase is applied to the planar electrodes 26a and 26b of the piezoelectric body 16A, the planar electrodes 26c and 26d of the piezoelectric body 16B, the planar electrode 23a of the piezoelectric body 13A and the reference electrodes 22a, 22b and 22c of the piezoelectric bodies 12A, 12B and 12C as shown in FIG. 11.

At this time, when the polarized portion 16b on the front right side of the piezoelectric body 16A and the polarized portion 16c on the front left side of the piezoelectric body 16B as the first polarized portions are stretched in the longitudinal direction, the polarized portion 16a on the front left side of the piezoelectric body 16A and the polarized portion 16d on the front right side of the piezoelectric body 16B as second polarized portions contract in the longitudinal direction, thus amplifying the bending vibration of the vibrating body 10.

The piezoelectric body 13A as the third piezoelectric body causes stretching vibration in the same phase in the longitudinal direction, thus amplifying the stretching vibration of the vibrating body 10.

Then, the output fetching member 31 causes amplified elliptic vibration and the rotor 51 rotates normally at higher speed by receiving the greater frictional force.

As described above, according to the present embodiment, the rotor 51 rotates at higher speed and a high output may be obtained because the present embodiment is arranged so that the bending vibration is amplified by the polarized portion 16a on the front left side of the piezoelectric body 16A and the polarized portion 16d on the front right side of the piezoelectric body 16B and the stretching vibration of the vibrating body 10 is amplified by the piezoelectric body 13A and the stretching vibration and the bending vibration of the vibrating body 10 are both amplified.

[Sixth Embodiment]

Figure 13:
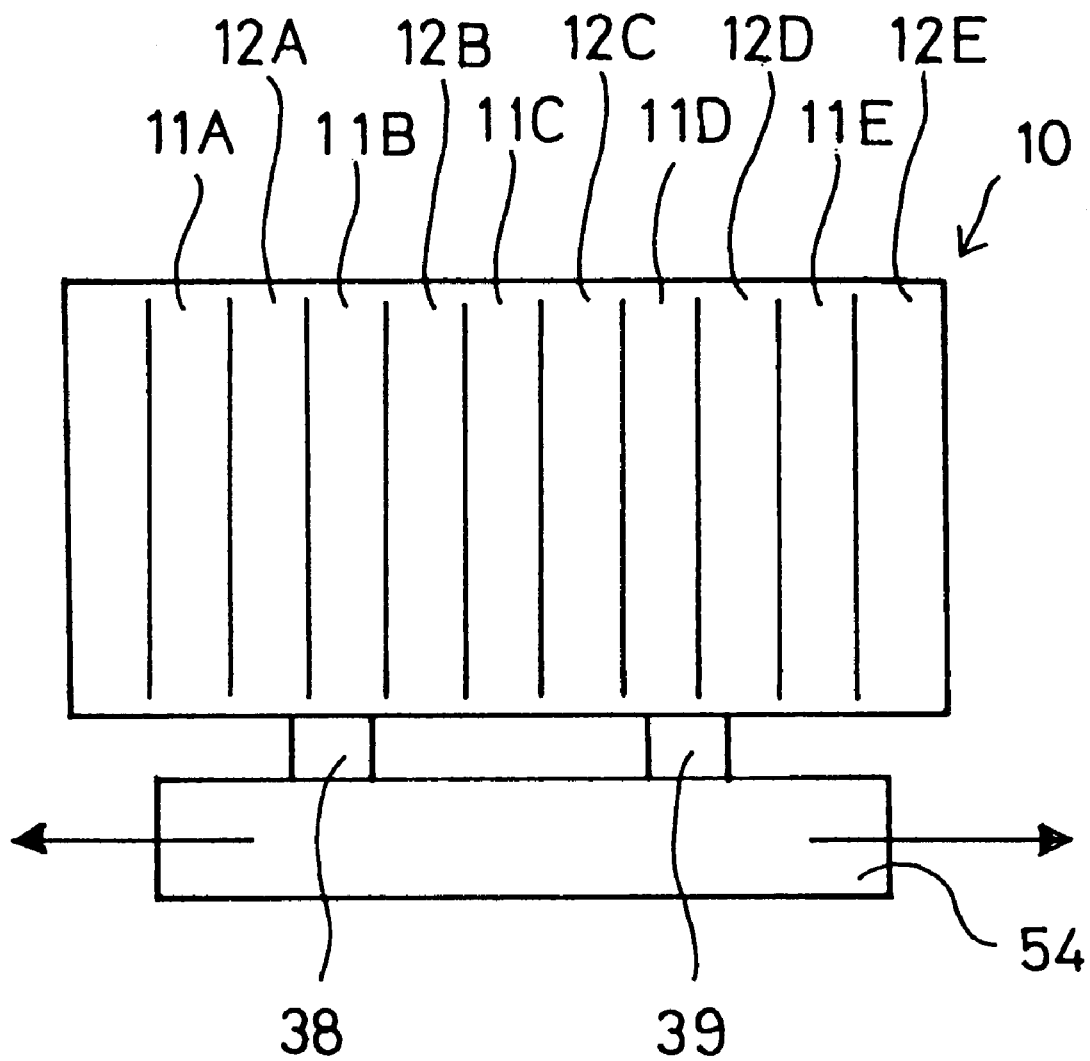
FIG. 13 is an explanatory diagram showing a side structure of a sixth embodiment in which the present invention is applied to an ultrasonic motor.

FIG. 13 shows a side structure of a sixth embodiment in which the present invention is applied to an ultrasonic motor.

While the present embodiment is constructed almost in the same manner as in the first embodiment, it is characterized in that the vibrating body 10 is fixed, a pair of output fetching members 38 and 39 are fixed at the edge portion thereof in the direction vertical to the laminating direction and the output fetching members 38 and 39 are abutted with a moving body 54.

Thereby, elliptic vibration obtained by combining bending vibration and stretching vibration is produced even in the horizontal direction of the vibrating body 10, so that the moving body 54 abutting with the output fetching members 38 and 39 can move linearly in the right or left direction by using the piezoelectric vibrators as described above.

[Seventh Embodiment]

Figure 14:
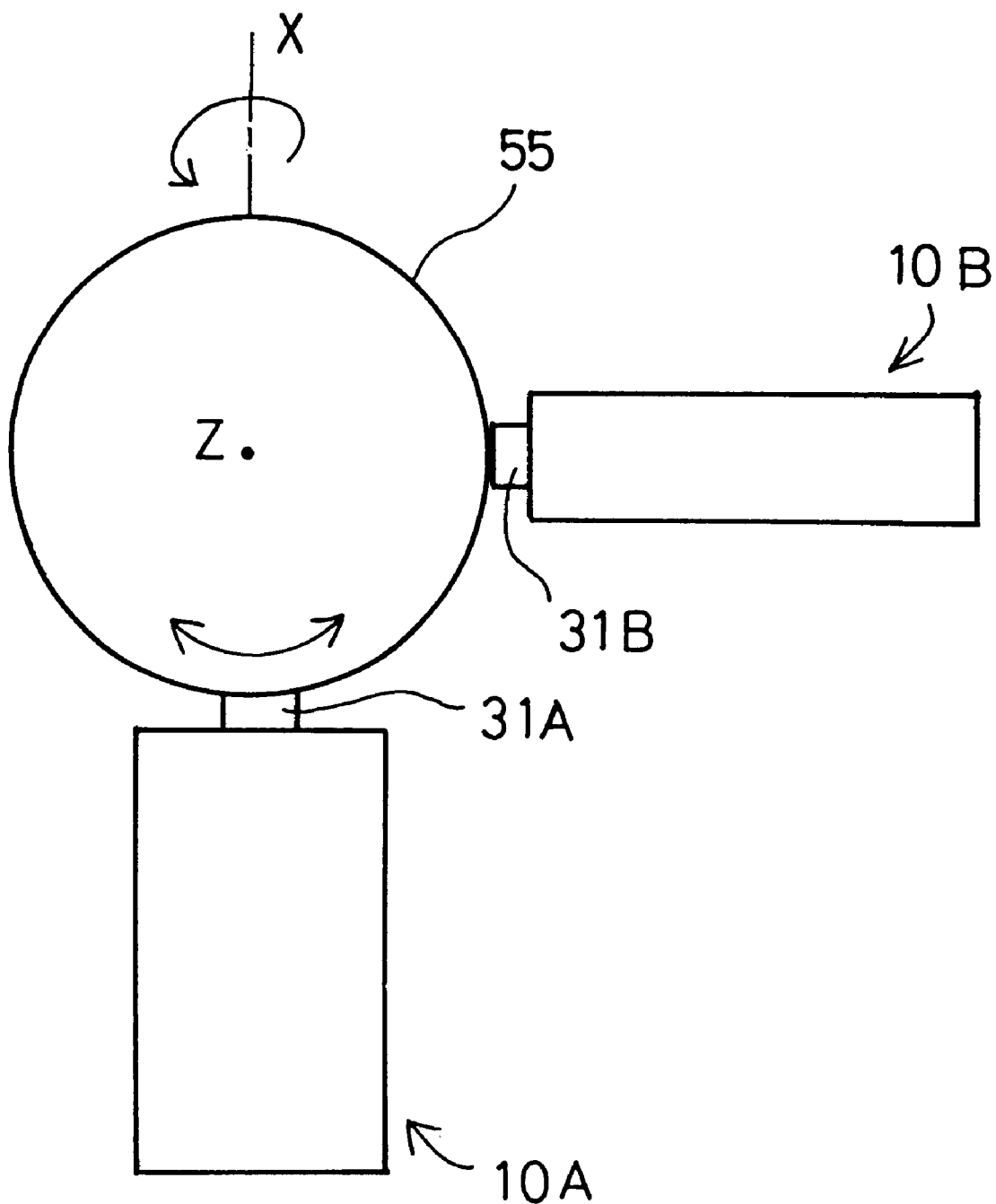
FIG. 14 is an explanatory diagram showing a structure of a seventh embodiment in which the present invention is applied to an ultrasonic motor.

FIG. 14 shows a structure of a seventh embodiment in which the present invention is applied to an ultrasonic motor.

The present embodiment is characterized in that two vibrating bodies 10A and 10B are disposed while opening by 90° with respect to a spherical rotor 55 centering on a point Z in the figure and respective output fetching members 31A and 31B abut with the spherical rotor 55.

Here, the vibrating bodies 10A and 10B have the same laminating structure and disposition of electrodes as in the second embodiment and only the stretching vibration, only the bending vibration or the combined elliptic vibration may be produced by selecting the electrodes to which voltage is applied.

The use of the present embodiment will be explained below based on FIG. 14.

The spherical rotor 55 may be moved in triaxial directions by vibrating both vibrating bodies 10A and 10B. At this time, the output fetching members 31A and 31B cause elliptic vibration, respectively. The output fetching member 31A applies frictional force in the direction of rotation about the Z-axis of the spherical rotor 55 and the output fetching member 31B applies frictional force in the direction of rotation about the X-axis of the spherical rotor 55. The spherical rotor 55 rotates about the X and Z-axes in the same time, thus realizing the triaxial movement.

Meanwhile, the spherical rotor 55 may be rotated in one direction by causing the vibrating body 10A to produce combined vibration and the vibrating body 10B to produce only stretching vibration.

At this time, the output fetching member 31A applies frictional force to the spherical rotor 55 in the direction of rotation about the Z-axis and the output fetching member 31B stretches and applies force only in the direction of the center of the spherical rotor 55, so that they do not hamper the spherical rotor 55 from rotating about the Z-axis.

As described above, according to the present embodiment, the use of the two vibrating bodies 10A and 10B allows the rotational movement in one direction and the triaxial movement of the spherical rotor 55 to be realized.

[Eighth Embodiment]

Figure 15:
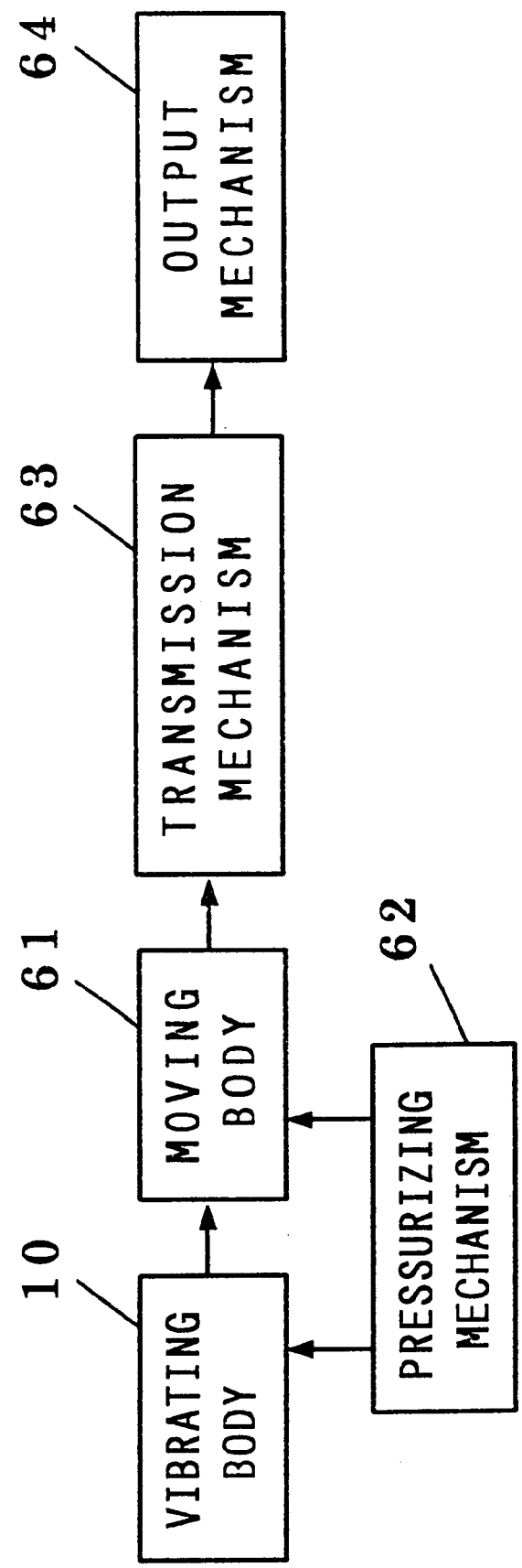
FIG. 15 is an explanatory diagram showing a block of an eight embodiment in which the present invention is applied to an ultrasonic motor.
Figure 16:
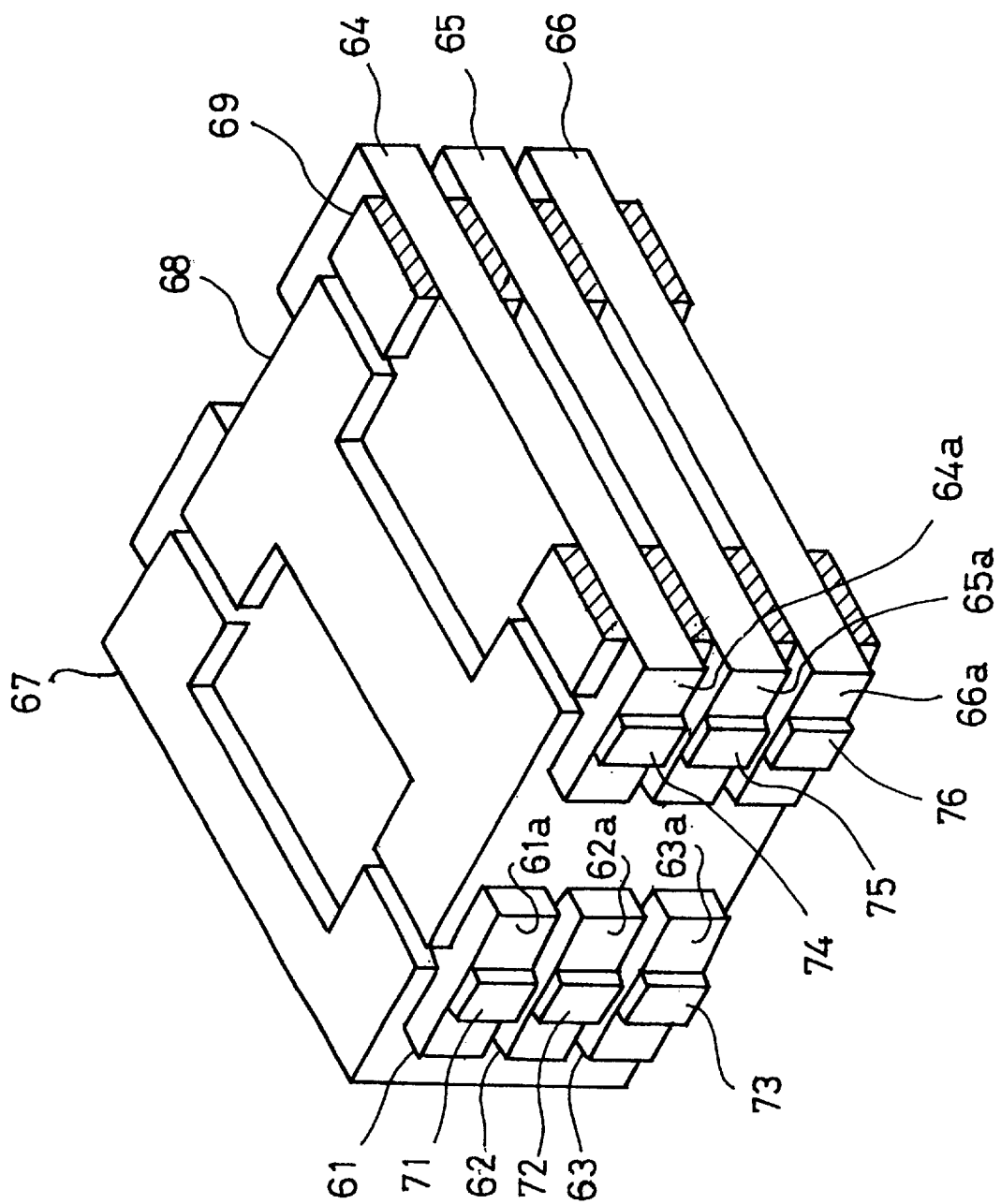
FIG. 16 is a perspective view showing a structure of a prior art ultrasonic motor.

FIG. 15 is a block diagram showing an eighth embodiment in which the inventive ultrasonic motor is applied to an electronic apparatus.

The electronic apparatus comprises the above-mentioned vibrating body 10, a moving body 61 moved by the vibrating body 10, a pressurizing mechanism 62 for applying pressurizing force to the moving body 61 and the vibrating body 10, a transmission mechanism 63 operating in linkage with the moving body 61 and an output mechanism 64 that moves based on the operation of the transmission mechanism 63.

Here, a transmission wheel such as a gear and a frictional gear is used as the transmission mechanism 63. As the output mechanism 64, a shutter driving mechanism and a lens driving mechanism are used in the case of a camera for example, a needle driving mechanism and a calendar driving mechanism are used in case of an electronic watch, and a cutter feeding mechanism and a workpiece feeding mechanism are used in case of a work machine.

The electronic apparatus equipped with the ultrasonic motor of the present embodiment may be realized in electronic watches, measuring instruments, cameras, printers, work machines, robots, moving apparatuses and the like.

Further, a driving mechanism may be realized just by the ultrasonic motor itself by attaching an output shaft to the moving body 61 and by comprising a power transmission mechanism for transmitting torque from the output shaft.

As described above, according to the invention, as the inventive ultrasonic motor is arranged such that the polarized portion of the first piezoelectric body and the polarized portion of the second piezoelectric body stretch respectively in the polarizing direction so that stretching vibration and bending vibration are produced by overlapping the respective vibrations in the longitudinal direction. The output may be increased by utilizing the vibration in the longitudinal direction caused by the piezoelectric longitudinal effect and electrical energy may be utilized very efficiently.

Further, the piezoelectric vibrators are laminated in a body without using fixing means so as not to suppress the vibration and to fix the vibrating direction, vibration loss of the respective piezoelectric vibrators may be suppressed, the vibrating direction may be prevented from varying and the structure of the device may be simplified.

According to the invention, a driving force in both normal and reverse directions may be obtained and the output may be controlled by displacing the bending vibration or by changing the phase because the elliptic vibration for rotating in the reverse direction is taken out by causing bending vibration having a different phase or by amplifying the bending vibration by exciting the second polarized portion with a phase different from the first polarized portion in the same time.

According to the invention, by providing a third piezoelectric body which vibrates in the same phase with the stretching vibration, the high-output ultrasonic motor may be realized because the stretching vibration is amplified.

According to the invention, by providing a third polarized portion that vibrates in the same phase with the stretching vibration, the high-output ultrasonic motor may be realized because the stretching vibration is amplified.

According to the invention, by abutting the moving body to a piezoelectric vibrator in the horizontal direction, the moving body may be moved in the horizontal direction of the piezoelectric vibrator.

According to the invention, by abutting the laminated piezoelectric vibrator at least at one point of a spherical moving body of the ultrasonic motor, the spherical moving body may be moved arbitrary.

According to another aspect of the invention, an electronic apparatus using the ultrasonic motor may be realized.

While the preferred embodiments have been described, variations thereto will occur to those skilled in the art within the scope of the present inventive concepts which are delineated by the following claims.

What is claimed is:

1. An ultrasonic motor having a movable member frictionally driven by ultrasonic vibration of a vibrating body, the ultrasonic motor comprising: a vibrating body polarized in a given direction and comprised of a first piezoelectric body and a second piezoelectric body laminated to the first piezoelectric body in a preselected direction generally parallel to the polarized direction, each of the first and second piezoelectric bodies having a first polarized portion and a second polarized portion, the first polarized portion of the first piezoelectric body being aligned in the preselected direction with the second polarized portion of the second piezoelectric body and being disposed in non-overlapping relation with the first polarized portion of the second piezoelectric body, and the second polarized portion of the first piezoelectric body being aligned in the preselected direction with the first polarized portion of the second piezoelectric body and being disposed in non-overlapping relation with the second polarized portion of the second piezoelectric body; and a movable member frictionally driven by a combination of a stretching vibration and a bending vibration generated by applying a driving signal to the first polarized portions of the first and second piezoelectric bodies or to the second polarized portions of the first and second piezoelectric bodies, the vibrating body having a third piezoelectric body disposed between the first and second piezoelectric bodies for undergoing vibration in a phase identical to that of the stretching vibration.

2. In an electronic apparatus having an output mechanism for producing an output motion, an ultrasonic motor as claimed in claim 1 for driving the output mechanism to produce the output motion.

3. An ultrasonic motor as claimed in claim 1; wherein the first polarized portions and the second polarized portions of the first and the second piezoelectric bodies are polarized in different directions.

4. An ultrasonic motor as claimed in claim 1; wherein the movable member is disposed in contact with a side of the vibrating body.

5. An ultrasonic motor having a movable member frictionally driven by ultrasonic vibration of a vibrating body, the ultrasonic motor comprising: a vibrating body polarized in a given direction and comprised of a first piezoelectric body and a second piezoelectric body laminated to the first piezoelectric body in a preselected direction generally parallel to the polarized direction, each of the first and second piezoelectric bodies having a first polarized portion and a second polarized portion, the first polarized portion of the first piezoelectric body being aligned in the preselected direction with the second polarized portion of the second piezoelectric body and being disposed in non-overlapping relation with the first polarized portion of the second piezoelectric body, and the second polarized portion of the first piezoelectric body being aligned in the preselected direction with the first polarized portion of the second piezoelectric body and being disposed in non-overlapping relation with the second polarized portion of the second piezoelectric body; and a movable member frictionally driven by a combination of a stretching vibration and a bending vibration generated by applying a driving signal to the first polarized portions of the first and second piezoelectric bodies or to the second polarized portions of the first and second piezoelectric bodies, the first piezoelectric body having a third polarized portion disposed between the first polarized portion and the second polarized portion of the first piezoelectric body for undergoing vibration in a phase identical to that of the stretching vibration.

6. An ultrasonic motor having a movable member frictionally driven by ultrasonic vibration of a vibrating body, the ultrasonic motor comprising: a vibrating body polarized in a given direction and comprised of a first piezoelectric body and a second piezoelectric body laminated to the first piezoelectric body in a preselected direction generally parallel to the polarized direction, each of the first and second piezoelectric bodies having a first polarized portion and a second polarized portion, the first polarized portion of the first piezoelectric body being aligned in the preselected direction with the second polarized portion of the second piezoelectric body and being disposed in non-overlapping relation with the first polarized portion of the second piezoelectric body, and the second polarized portion of the first piezoelectric body being aligned in the preselected direction with the first polarized portion of the second piezoelectric body and being disposed in non-overlapping relation with the second polarized portion of the second piezoelectric body; and a movable member frictionally driven by a combination of a stretching vibration and a bending vibration generated by applying a driving signal to the first polarized portions of the first and second piezoelectric bodies or to the second polarized portions of the first and second piezoelectric bodies, the second piezoelectric body having a third polarized portion disposed between the first polarized portion and the second polarized portion of the second piezoelectric body for undergoing vibration in a phase identical to that of the stretching vibration.

7. An ultrasonic motor having a movable member frictionally driven by ultrasonic vibration of a vibrating body, the ultrasonic motor comprising: a vibrating body polarized in a given direction and comprised of a first piezoelectric body and a second piezoelectric body laminated to the first piezoelectric body in a preselected direction generally parallel to the polarized direction, each of the first and second piezoelectric bodies having a first polarized portion and a second polarized portion, the first polarized portion of the first piezoelectric body being aligned in the preselected direction with the second polarized portion of the second piezoelectric body and being disposed in non-overlapping relation with the first polarized portion of the second piezoelectric body, and the second polarized portion of the first piezoelectric body being aligned in the preselected direction with the first polarized portion of the second piezoelectric body and being disposed in non-overlapping relation with the second polarized portion of the second piezoelectric body; and a movable member frictionally driven by a combination of a stretching vibration and a bending vibration generated by applying a driving signal having a first phase to the first polarized portions of the first and second piezoelectric bodies and applying a driving signal having a second phase different from the first phase to the second polarized portions of the second piezoelectric bodies, the first piezoelectric body having a third polarized portion disposed between the first polarized portion and the second polarized portion of the first piezoelectric body for undergoing vibration in a phase identical to that of the stretching vibration.

8. An ultrasonic motor having a movable member frictionally driven by ultrasonic vibration of a vibrating body, the ultrasonic motor comprising: a vibrating body polarized in a given direction and comprised of a first piezoelectric body and a second piezoelectric body laminated to the first piezoelectric body in a preselected direction generally parallel to the polarized direction, each of the first and second piezoelectric bodies having a first polarized portion and a second polarized portion, the first polarized portion of the first piezoelectric body being aligned in the preselected direction with the second polarized portion of the second piezoelectric body and being disposed in non-overlapping relation with the first polarized portion of the second piezoelectric body, and the second polarized portion of the first piezoelectric body being aligned in the preselected direction with the first polarized portion of the second piezoelectric body and being disposed in non-overlapping relation with the second polarized portion of the second piezoelectric body; and a movable member frictionally driven by a combination of a stretching vibration and a bending vibration generated by applying a driving signal having a first phase to the first polarized portions of the first and second piezoelectric bodies and applying a driving signal having a second phase different from the first phase to the second polarized portions of the second piezoelectric bodies, the second piezoelectric body having a third polarized portion disposed between the first polarized portion and the second polarized portion of the second piezoelectric body for undergoing vibration in a phase identical to that of the stretching vibration.

9. An ultrasonic motor having a movable member frictionally driven by ultrasonic vibration of vibrating bodies, the ultrasonic motor comprising: a plurality of vibrating bodies each polarized in a given direction and each comprised of a first piezoelectric body and a second piezoelectric body laminated to the first piezoelectric body in a preselected direction generally parallel to the polarized direction, each of the first and second piezoelectric bodies of each vibrating body having a first polarized portion and a second polarized portion, the first polarized portion of the first piezoelectric body being aligned in the preselected direction with the second polarized portion of the second piezoelectric body and being disposed in non-overlapping relation with the first polarized portion of the second piezoelectric body, and the second polarized portion of the first piezoelectric body being aligned in the preselected direction with the first polarized portion of the second piezoelectric body and being disposed in non-overlapping relation with the second polarized portion of the second piezoelectric body; and a movable member connected to each vibrating body, the movable member being frictionally driven by a combination of a stretching vibration and a bending vibration generated by applying a driving signal to the first polarized portions of the first and second piezoelectric bodies of each vibrating body or to the second polarized portions of the first and second piezoelectric bodies of each vibrating body, each of the vibrating bodies having a third piezoelectric body disposed between the first and second piezoelectric bodies for undergoing vibration in a phase identical to that of the stretching vibration.

10. An ultrasonic motor having a movable member frictionally driven by ultrasonic vibration of vibrating bodies, the ultrasonic motor comprising: a plurality of vibrating bodies each polarized in a given direction and each comprised of a first piezoelectric body and a second piezoelectric body laminated to the first piezoelectric body in a preselected direction generally parallel to the polarized direction, each of the first and second piezoelectric bodies of each vibrating body having a first polarized portion and a second polarized portion, the first polarized portion of the first piezoelectric body being aligned in the preselected direction with the second polarized portion of the second piezoelectric body and being disposed in non-overlapping relation with the first polarized portion of the second piezoelectric body, and the second polarized portion of the first piezoelectric body being aligned in the preselected direction with the first polarized portion of the second piezoelectric body and being disposed in non-overlapping relation with the second polarized portion of the second piezoelectric body; and a movable member connected to each vibrating body, the movable member being frictionally driven by a combination of a stretching vibration and a bending vibration generated by applying a driving signal to the first polarized portions of the first and second piezoelectric bodies of each vibrating body or to the second polarized portions of the first and second piezoelectric bodies of each vibrating body, the first piezoelectric body of each of the vibrating bodies having a third polarized portion disposed between the first polarized portion and the second polarized portion of the first piezoelectric body for undergoing vibration in a phase identical to that of the stretching vibration.

11. In an electronic apparatus having an output mechanism for producing an output motion, an ultrasonic motor as claimed in claim 5 for driving the output mechanism to produce the output motion.

12. In an electronic apparatus having an output mechanism for producing an output motion, an ultrasonic motor as claimed in claim 9 for driving the output mechanism to produce the output motion.

13. In an electronic apparatus having an output mechanism for producing an output motion, an ultrasonic motor as claimed in claim 10 for driving the output mechanism to produce the output motion.

14. An ultrasonic motor as claimed in claim 5; wherein the movable member is disposed in contact with a side of the vibrating body.

15. An ultrasonic motor comprising:
a vibrational body polarized in a given direction and comprised of a first piezoelectric body and a second piezoelectric body laminated to the first piezoelectric body, each of the first and second piezoelectric bodies having a first polarized portion and a second polarized portion, the first polarized portion of the first piezoelectric body being laminated with the first polarized portion of the second piezoelectric body, and the second polarized portion of the first piezoelectric body being laminated with the second polarized portion of the second piezoelectric body;
a movable member frictionally driven by a combination of a stretching vibration generated in a laminated direction of the first and second piezoelectric bodies and a bending vibration generated in a direction transverse to the laminated direction of the first and second piezoelectric bodies; and
generating means for generating the combined stretching and bending vibrations to frictionally drive the movable member by application of a voltage to side electrodes of the first polarized portion of the first piezoelectric body and the second polarized portion of the second piezoelectric body or to side electrodes of the second polarized portion of the first piezoelectric body and the first polarized portion of the second piezoelectric body.

16. An ultrasonic motor comprising:
a vibrational body polarized in a given direction and comprised of a first piezoelectric body and a second piezoelectric body laminated to the first piezoelectric body, each of the first and second piezoelectric bodies having a first polarized portion and a second polarized portion, the first polarized portion of the first piezoelectric body being laminated with the first polarized portion of the second piezoelectric body, and the second polarized portion of the first piezoelectric body being laminated with the second polarized portion of the second piezoelectric body;

a movable member frictionally driven by a combination of a stretching vibration generated in a laminated direction of the first and second piezoelectric bodies and a bending vibration generated in a direction transverse to the laminated direction of the first and second piezoelectric bodies generated; and generating means for generating the combined stretching and bending vibrations by application of a voltage having a first phase to side electrodes of the first polarized portion of the first piezoelectric body and the second polarized portion of the second piezoelectric body and by application of a voltage having a second phase different from the first phase to side electrodes of the second polarized portion of the first piezoelectric body and the first polarized portion of the second piezoelectric body.

17. An ultrasonic motor comprising:

a vibrational body polarized in a given direction and comprised of a first piezoelectric body, a second piezoelectric body laminated to the first piezoelectric body, and a third piezoelectric body having a polarized portion and being laminated between the first and second piezoelectric bodies, each of the first and second piezoelectric bodies having a first polarized portion and a second polarized portion, the first polarized portion of the first piezoelectric body being laminated with the first polarized portion of the second piezoelectric body, and the second polarized portion of the first piezoelectric body being laminated with the second polarized portion of the second piezoelectric body;

a movable member frictionally driven by a combination of a stretching vibration generated in a laminated direction of the first, second and third piezoelectric bodies and a bending vibration generated in a direction transverse to the laminated direction of the first, second and third piezoelectric bodies; and generating means for generating the combined stretching and bending vibrations to frictionally drive the movable member by application of a voltage to side electrodes of the first polarized portion of the first piezoelectric body, the second polarized portion of the second piezoelectric body and the polarized portion of the third piezoelectric body, or by application of a voltage to side electrodes of the second polarized portion of the first piezoelectric body, the first polarized portion of the second piezoelectric body and the polarized portion of the third piezoelectric body.

18. A ultrasonic motor comprising:

a vibrational body polarized in a given direction and comprised of a first piezoelectric body, a second piezoelectric body laminated to the first piezoelectric body, and a third piezoelectric body having a polarized portion and being laminated between the first and second piezoelectric bodies, each of the first and second piezoelectric bodies having a first polarized portion and a second polarized portion, the first polarized portion of the first piezoelectric body being laminated with the first polarized portion of the second piezoelectric body, and the second polarized portion of the first piezoelectric body being laminated with the second polarized portion of the second piezoelectric body;

a movable member frictionally driven by a combination of a stretching vibration generated in a laminated direction of the first, second and third piezoelectric bodies and a bending vibration generated in a direction transverse to the laminated direction of the piezoelectric bodies; and generating means for generating the combined stretching and bending vibrations to frictionally drive the movable member by application of a first voltage having a first phase and a second voltage having a second phase different from the first phase to side electrodes of the polarized portion of the third piezoelectric body and to side electrodes of either the first polarized portion of the first piezoelectric body and the second polarized portion of the second piezoelectric body or the second polarized portion of the first piezoelectric body and the first polarized portion of the second piezoelectric body.

19. An ultrasonic motor comprising:

a vibrating body polarized in a given direction and comprised of a first piezoelectric body and a second piezoelectric body laminated to the first piezoelectric body, each of the first and second piezoelectric bodies having first, second and third polarized portions, the first polarized portion of the first piezoelectric body being laminated with the first polarized portion of the second piezoelectric body, the second polarized portion of the first piezoelectric body being laminated with the second polarized portion of the second piezoelectric body, and the third polarized portion of the first piezoelectric body being laminated with the third polarized portion of the second piezoelectric body;

a movable member frictionally driven by a combination of a stretching vibration generated in a laminated direction of the first and second piezoelectric bodies and a bending vibration generated in a direction transverse to the laminated direction of the first and second piezoelectric bodies; and generating means for generating the combined stretching and bending vibrations to frictionally drive the movable member by application of a voltage to side electrodes of the second polarized portions of the first and second piezoelectric bodies, the first polarized portion of the first piezoelectric body, and the third polarized portion of the second piezoelectric body or to side electrodes of the second polarized portions of the first and second piezoelectric bodies, the third polarized portion of the first piezoelectric body and the first polarized portion of the second piezoelectric body.

20. An ultrasonic motor comprising:

a vibrating body polarized in a given direction and comprised of a first piezoelectric body and a second piezoelectric body laminated to the first piezoelectric body, each of the first and second piezoelectric bodies having first, second and third polarized portions, the first polarized portion of the first piezoelectric body being laminated with the first polarized portion of the second piezoelectric body, the second polarized portion of the first piezoelectric body being laminated with the second polarized portion of the second piezoelectric body, and the third polarized portion of the first piezoelectric body being laminated with the third polarized portion of the second piezoelectric body; and a movable member frictionally driven by a combination of a stretching vibration generated in a laminated direction of the first and second piezoelectric bodies and a bending vibration generated in a direction transverse to the laminated direction of the first and second piezoelectric bodies; and generating means for generating the combined stretching and bending vibrations by application of a voltage having a first phase and a voltage having a second phase different from the first phase to side electrodes of the first polarized portion of the first piezoelectric body and the third polarized portion of the second piezoelectric body, the third polarized portion of the first piezoelectric body and the first polarized portion of the second piezoelectric body, or the second polarized portions of the first and the second piezoelectric bodies.

* * * * *